(12) United States Patent
Hoshi

(10) Patent No.: US 11,107,913 B2
(45) Date of Patent: Aug. 31, 2021

(54) SEMICONDUCTOR DEVICE

(71) Applicant: FUJI ELECTRIC CO., LTD., Kawasaki (JP)

(72) Inventor: Yasuyuki Hoshi, Matsumoto (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 82 days.

(21) Appl. No.: 16/751,373

(22) Filed: Jan. 24, 2020

(65) Prior Publication Data
US 2020/0295182 A1    Sep. 17, 2020

(30) Foreign Application Priority Data
Mar. 13, 2019    (JP) .............................. JP2019-046541

(51) Int. Cl.
*H01L 29/78*    (2006.01)
*H01L 29/16*    (2006.01)

(52) U.S. Cl.
CPC ...... *H01L 29/7813* (2013.01); *H01L 29/1608* (2013.01); *H01L 29/7804* (2013.01)

(58) Field of Classification Search
CPC ............. H01L 29/0696; H01L 29/1608; H01L 29/4236; H01L 29/7802–7815
See application file for complete search history.

(56) References Cited

U.S. PATENT DOCUMENTS

2012/0205669 A1    8/2012  Miura et al.
2017/0053984 A1*   2/2017  Sugawara ........... H01L 29/0865

FOREIGN PATENT DOCUMENTS

JP    4962664 B2    6/2012

* cited by examiner

*Primary Examiner* — Daniel P Shook
(74) *Attorney, Agent, or Firm* — Rabin & Berdo, P.C.

(57) ABSTRACT

In an effective region of an active region, main semiconductor elements that are vertical MOSFETs and a source pad of the main semiconductor elements are provided. In a non-operating region of the active region, a gate pad of the main semiconductor elements is provided on a front surface of a semiconductor substrate. Directly beneath the gate pad, in a surface region of the front surface of the semiconductor substrate, a p-type region is provided spanning the non-operating region of the active region overall. The p-type region of the non-operating region of the active region is electrically connected to the source pad and forms a parasitic diode by a pn junction with an n⁻-type drift region when the main semiconductor elements are OFF. The p-type region of the non-operating region of the active region has a rectangular planar shape with rounded or chamfered corner portions in a planar view.

7 Claims, 12 Drawing Sheets

SEMICONDUCTOR DEVICE

CROSS REFERENCE TO RELATED APPLICATIONS

This application is based upon and claims the benefit of priority of the prior Japanese Patent Application No. 2019-046541, filed on Mar. 13, 2019, the entire contents of which are incorporated herein by reference.

BACKGROUND OF THE INVENTION

1. Field of the Invention

Embodiments of the invention relate to a semiconductor device.

2. Description of the Related Art

Silicon (Si) is used as a material for power semiconductor devices that control high voltage and/or large current. There are several types of power semiconductor devices such as bipolar transistors, insulated gate bipolar transistors (IGBTs), and metal oxide semiconductor field effect transistors (MOSFETs) that have an insulated gate formed by a three-layered structure including a metal, an oxide film, and a semiconductor material. These devices are selectively used according to an intended purpose.

For example, bipolar transistors and IGBTs have high current density compared to MOSFETs, and can be adapted for large current but cannot be switched at high speeds. In particular, the limit of switching frequency is about several kHz for bipolar transistors and about several tens of kHz for IGBTs. On the other hand, power MOSFETs have low current density compared to bipolar transistors and IGBTs, and are difficult to adapt for large current but can be switched at high speeds up to about several MHz.

Further, MOSFETs structurally differ from IGBTs, have a built-in parasitic diode formed by a pn junction between a p-type base region and an n⁻-type drift region, and may use this parasitic diode as a free-wheeling diode for protecting the MOSFET. Therefore, instances in in which a MOSFET is used as an inverter device are gaining attention in terms of being economical since no external free-wheeling diode needs to be connected to the MOSFET.

There is a strong demand in the market for large-current, high-speed power semiconductor devices. Thus, IGBTs and power MOSFETs have been intensively developed and improved, and the performance of power devices has substantially reached the theoretical limit determined by the material. In terms of power semiconductor devices, semiconductor materials to replace silicon have been investigated and silicon carbide (SiC) has been focused on as a semiconductor material enabling production (manufacture) of a next-generation power semiconductor device having low ON voltage, high-speed characteristics, and high-temperature characteristics.

Silicon carbide is chemically a very stable semiconductor material, has a wide bandgap of 3eV, and can be used very stably as a semiconductor material even at high temperatures. Further, silicon carbide has a critical field strength that is at least ten times greater than the critical field strength of silicon and therefore, is expected to be a semiconductor material capable of sufficiently reducing ON resistance. Such characteristics of silicon carbide are shared by other wide bandgap semiconductor materials that have a bandgap wider than that of silicon (hereinafter, wide bandgap semiconductor material).

A structure of a conventional semiconductor device will be described taking, as an example, an n-channel MOSFET that uses silicon carbide (SiC) as a wide bandgap semiconductor material. FIG. 16 is a plan view of a layout of the conventional semiconductor device, as viewed from a front surface of a semiconductor substrate. A conventional semiconductor device 220 depicted in FIG. 16 is a vertical MOSFET 211 having an effective region 201a and a non-operating region 201b in an active region 201 of a semiconductor substrate 210 containing silicon carbide.

The effective region 201a of the active region 201 is a region in which a main current of the MOSFET 211 flows during an ON state of the MOSFET 211. In the effective region 201a of the active region 201, a source pad 221a of the MOSFET 211 is provided on a front surface of the semiconductor substrate 210. Directly beneath the source pad 221a, unit cells (functional units of an element) of the MOSFET 211 are provided in the semiconductor substrate 210.

The non-operating region 201b of the active region 201 is a region that does not operate as the MOSFET 211 and in which a gate pad 221b of the MOSFET 211 is provided on the front surface of the semiconductor substrate 210. Directly beneath the gate pad 221b, a p-type region 230 is provided in a surface region of the front surface of the semiconductor substrate 210, spanning substantially the non-operating region 201b of the active region 201 overall. Reference numerals 202, 203 are an edge termination region and a gate runner, respectively.

Further, for larger currents, a trench gate structure in which a channel (inversion layer) is formed in a direction orthogonal to the front surface of the semiconductor substrate, along a side wall of a trench, is advantageous in terms of cost as compared to a planar gate structure in which a channel is formed along the front surface of the semiconductor substrate. A reason for this is that the trench gate structure enables unit cell (structural unit of an element) density per unit area to be increased and current density per unit area to be increased.

A rate of temperature rise relative to a volume occupied by the unit cells increases by an extent to which device current density is increased and therefore, to enhance discharge efficiency and stabilize reliability, a double-sided cooling structure is necessary. Further, with consideration of reliability, on a single semiconductor substrate with a vertical MOSFET that is a main semiconductor element, a high-function structure in which high-function portions such as a current sensing portion, a temperature sensing portion, and an over-voltage protecting portion have to be disposed as circuit portions for protecting/controlling a main semiconductor element.

As a conventional semiconductor device, a device has been proposed that is a semiconductor device in which a p-type region that forms a parasitic diode by a pn junction with a drift region during an OFF state of the MOSFET is provided adjacent to an active region and by using, as a field oxide film, an insulating film that covers the p-type region forming the parasitic diode, electric field near the p-type region where a difference in electric potential with a gate electrode occurs when the MOSFET is OFF is suppressed and dielectric breakdown is suppressed (for example, refer to Japanese Patent No. 4962664).

SUMMARY OF THE INVENTION

According to an embodiment of the invention, a semiconductor device semiconductor device having an active region that includes an effective region and a non-operating region, includes a semiconductor substrate containing a semiconductor material having a bandgap wider than a bandgap of silicon, the semiconductor substrate having a first main surface and a second main surface opposite to the first main surface, a first-conductivity-type region of a first conductivity type, provided in the semiconductor substrate, the first-conductivity- type region having a first side, and a second side opposite to the first side and facing the second main surface of the semiconductor substrate, a first second-conductivity-type region of a second conductivity type provided in the semiconductor substrate, the first second-conductivity-type region having a first side, and a second side opposite to the first side and facing the second main surface of the semiconductor substrate, the second side of the first second-conductivity-type region being positioned closer to the first main surface of the semiconductor substrate than is the second side of the first-conductivity-type region and being in contact with the first-conductivity-type region, an insulated gate electric field effect transistor having a drift region that is formed by the first-conductivity-type region disposed in the effective region, a base region that is formed by the first second-conductivity-type region disposed in the effective region, a source pad provided on the first main surface of the semiconductor substrate and being electrically connected to the first second-conductivity-type region, the source pad facing the first side of the first second-conductivity-type region in a depth direction orthogonal to the first main surface of the semiconductor substrate, and a gate pad provided in the non-operating region, the gate pad being provided on the first main surface of the semiconductor substrate and being apart from the source pad, a drain electrode electrically connected to the second main surface of the semiconductor substrate, a second second-conductivity-type region of the second conductivity type, provided in the semiconductor substrate in the non-operating region, the second second-conductivity-type region having a first side facing the gate pad in the depth direction, and a second side opposite to the first side and facing the second main surface of the semiconductor substrate, the second side of the second second-conductivity-type region being positioned closer to the first main surface of the semiconductor substrate than is the second side of the first-conductivity-type region and being in contact with the first-conductivity-type region, and a third second-conductivity-type region of the second conductivity type, provided in the second second-conductivity-type region, an impurity concentration of the third second-conductivity-type region being higher than an impurity concentration of the second second-conductivity-type region. The second second-conductivity-type region is electrically connected to the source pad via the third second-conductivity-type region, and has a rectangular planar shape with four corner portions, each of the corner portions having a rounded or chamfered shape in a planar view. The third second-conductivity-type region surrounds a center portion of the second second-conductivity-type region in the planar view.

In the embodiment, the semiconductor device further includes one or more of active elements provided on the semiconductor substrate, each of the one or more of the active elements having an electrode pad, the electrode pad of each of the one or more of the active elements being provided in the non-operating region, on the first main surface of the semiconductor substrate, and being apart from the source pad and the gate pad in the planner view. The first side of the second second-conductivity-type region faces the gate pad, and the electrode pad of said each of the one or more of the active elements, respectively.

In the embodiment, the gate pad and the electrode pad of said each of the one or more of the active elements are disposed in a part of the non-operating region in the planner view. The second second-conductivity-type region covers an entire area of the non-operating region in the planner view.

In the embodiment, the gate pad and the electrode pad of said each of the one or more of the active elements are disposed in a part of the non-operating region in the planner view. The second second-conductivity-type region covers only a partial area of the non-operating region in which the gate pad and the electrode pad of said each of the one or more of the active elements are disposed in the planner view.

In the embodiment, the semiconductor device further includes one or more of active elements other than the insulated gate electric field effect transistor, and being provided on the semiconductor substrate, each of the active elements has an electrode pad, the electrode pad of said each active element being provided in the non-operating region, on the first main surface of the semiconductor substrate, and being apart from the source pad and the gate pad in the planner view. The first side of the second second-conductivity-type region faces the gate pad and the electrode pad of said each active element, respectively. The first side of the second second-conductivity-type region is disposed at a position in the depth direction apart from the first main surface of the semiconductor substrate on which the gate pad and the electrode pad of said each active element.

In the embodiment, the corner portions of the second second-conductivity-type region each have a rounded shape.

In the embodiment, the corner portions of the second second-conductivity-type region each have a chamfered shape with obtuse angles.

Objects, features, and advantages of the present invention are specifically set forth in or will become apparent from the following detailed description of the invention when read in conjunction with the accompanying drawings.

DETAILED DESCRIPTION OF THE INVENTION

Figure 16:
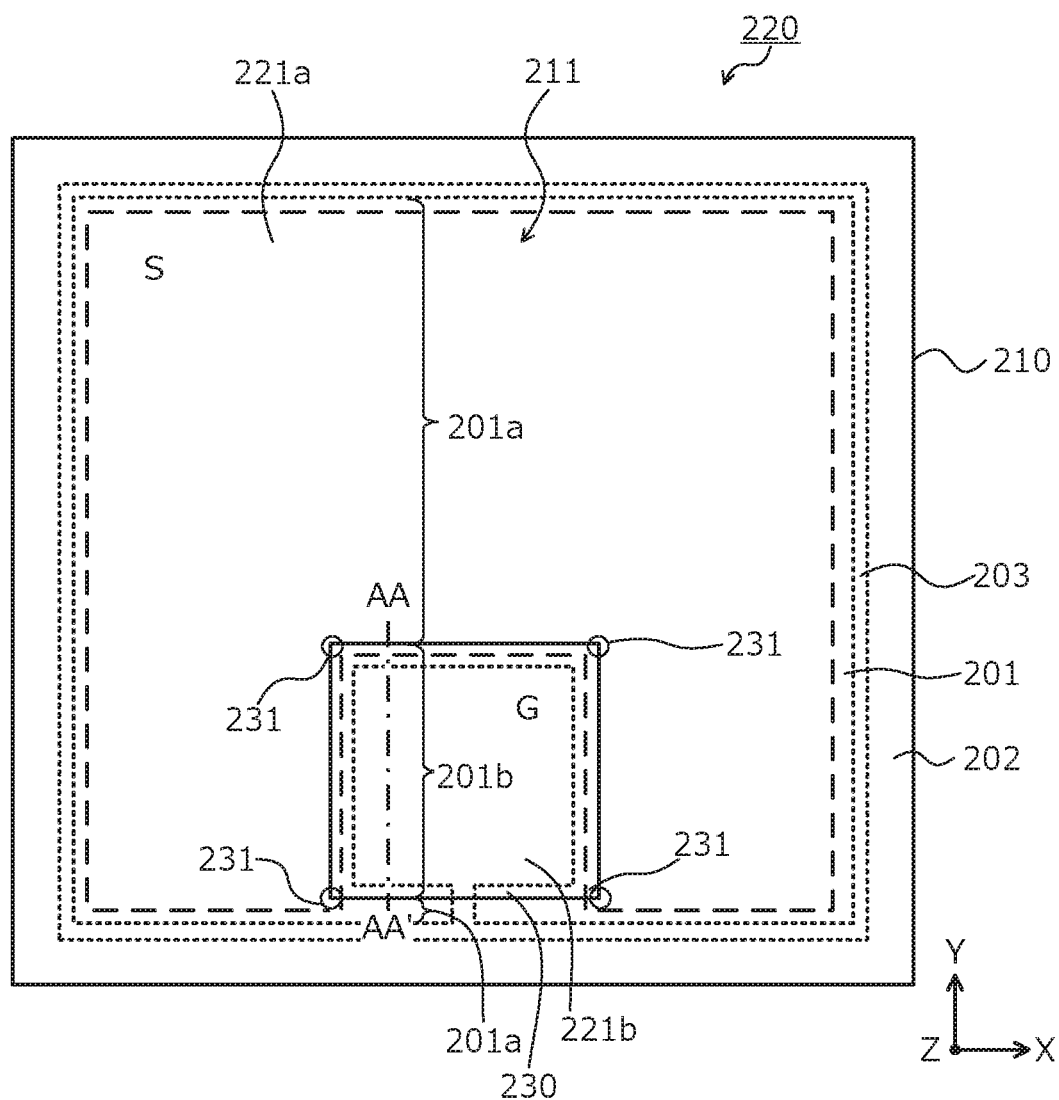
FIG. 16 is a plan view of a layout of a conventional semiconductor device, as viewed from a front surface of a semiconductor substrate.

First, problems associated with the conventional techniques will be discussed. As described above, in the conventional semiconductor device 220 (refer to FIG. 16), when the p-type region 230 of the non-operating region 201b of the active region 201 is connected to a source electric potential of the MOSFET 211, the p-type region 230 of the non-operating region 201b of the active region 201 is electrically connected to a p-type base region of the MOSFET 211. An outer peripheral portion of the p-type region 230 of the non-operating region 201b of the active region 201 opposes the source pad 221a in a direction (hereinafter, vertical direction) Z orthogonal to the front surface of the semiconductor substrate 210 and is electrically connected to the source pad 221a via a contact hole.

In this manner, when the p-type region 230 of the non-operating region 201b of the active region 201 is connected to the source electric potential of the MOSFET 211 and the MOSFET 211 switches from ON to OFF, a parasitic diode is further formed in the non-operating region 201b of the active region 201, by a pn junction between the p-type region 230 and the n⁻-type drift region concurrently with a formation of the parasitic diode by the pn junction between the p-type base region and the n⁻-type drift region of the MOSFET 211 in the effective region 201a of the active region 201.

As described above, in the non-operating region 201b of the active region 201, at the surface region of the front surface of the semiconductor substrate 210, the p-type region 230 alone is provided substantially spanning the non-operating region 201b overall. Therefore, a surface area of the parasitic diode formed in the non-operating region 201b of the active region 201 increases significantly. The parasitic diode formed in the non-operating region 201b of the active region 201 also turns OFF with the parasitic diode of the effective region 201a of the active region 201, when the MOSFET 211 switches from OFF to ON.

When the parasitic diode turns OFF, electron holes (holes) near the non-operating region 201b of the active region 201 pass through the p-type region 230 and out to the source pad 221a and therefore, electron hole current (reverse recovery current of the parasitic diode) concentrates at corner portions 231 of the p-type region 230. The corner portions 231 of the p-type region 230 are four vertices of the p-type region 230 having a rectangular planar shape and each forms substantially a right angle. As a result of concentration of the electron hole current, electric field at the corner portions 231 of the p-type region 230 of the non-operating region 201b of the active region 201 increases and dielectric breakdown may occur.

As the surface area of the parasitic diode of the non-operating region 201b of the active region 201 increases, electric field concentration at the corner portions 231 of the p-type region 230 of the non-operating region 201b of the active region 201 increases. Moreover, in a case of a wiring structure using a pin-shaped wiring member (hereinafter, terminal pin), there are additionally adverse effects of residual stress remaining at the surface of the semiconductor substrate 210 and occurring when the terminal pin is soldered to the gate pad 221b. Therefore, enhancement of reverse recovery capability of the parasitic diode is demanded.

Embodiments of a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

Figure 1:
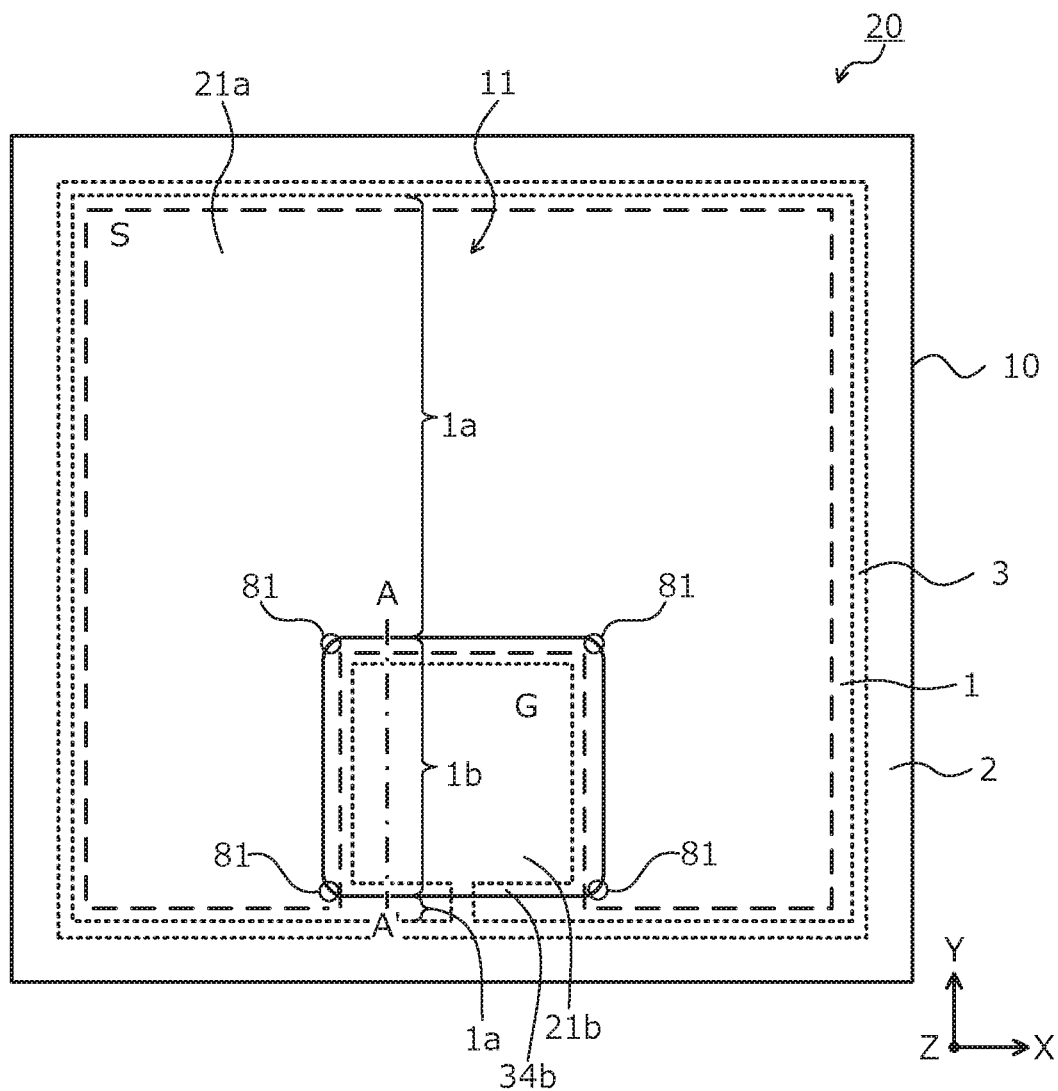
FIG. 1 is a plan view of a layout of a semiconductor device according to a first embodiment, as viewed from a front surface of a semiconductor substrate.

A semiconductor device according to a first embodiment is configured using, as the semiconductor material, a semiconductor material (wide bandgap semiconductor material) having a bandgap wider than that of silicon (Si). A structure of the semiconductor device according to the first embodiment will be described taking as an example, a case in which, for example, silicon carbide (SiC) is used as a wide bandgap semiconductor material. FIG. 1 is a plan view of a layout of the semiconductor device according to the first embodiment, as viewed from a front surface of a semiconductor substrate.

Figure 2:
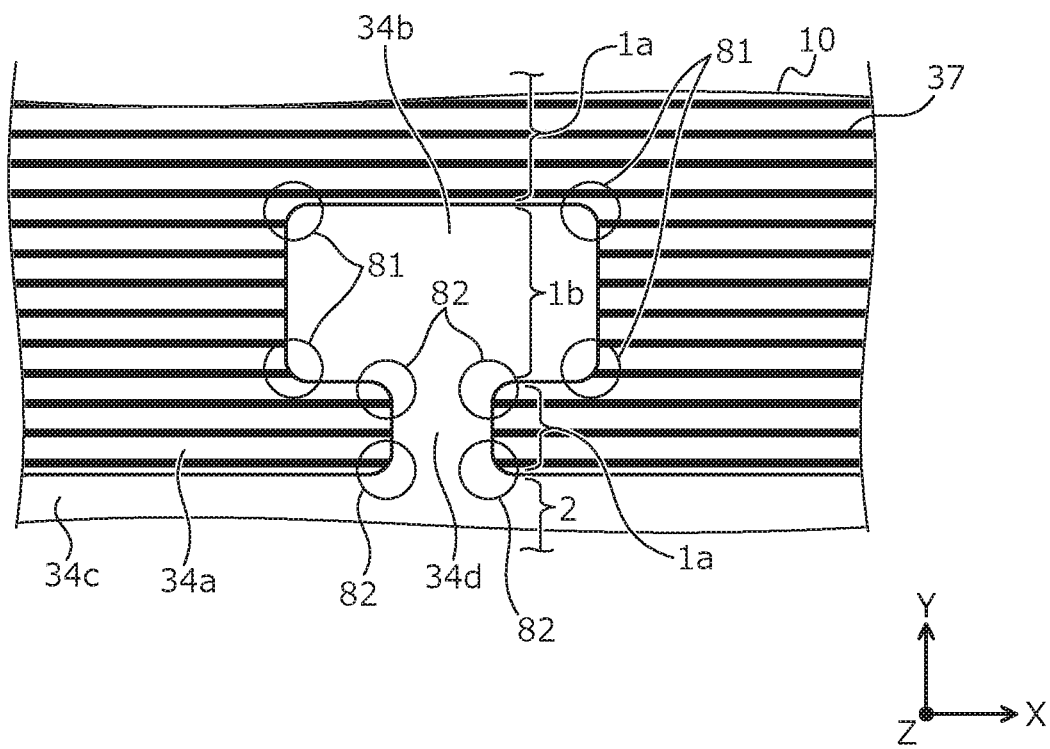
FIG. 2 is an example of an enlarged plan view near the gate pad in FIG. 1.
Figure 3:
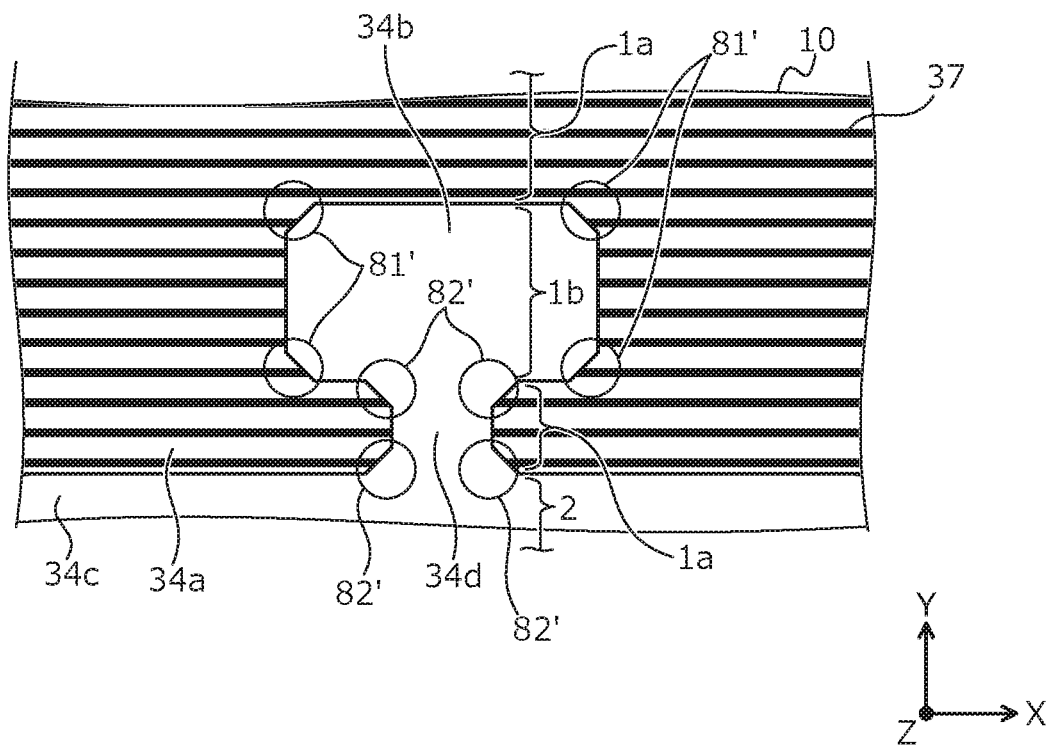
FIG. 3 is an example of an enlarged plan view near the gate pad in FIG. 1.
Figure 4:
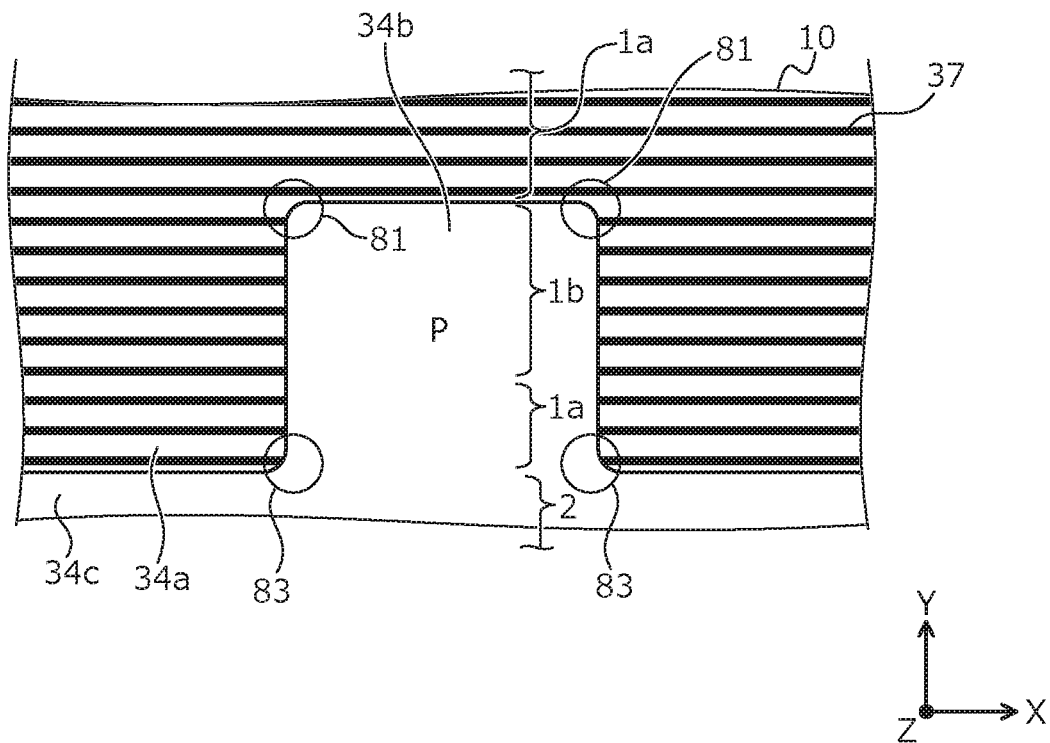
FIG. 4 is an example of an enlarged plan view near the gate pad in FIG. 1.

In FIG. 1, a source pad 21a is indicated by a coarse broken line while a gate pad 21b and a gate runner 3 are indicated by fine broken lines. In FIG. 1, the source pad 21a and the gate pad 21b are depicted in a rectangular planar shape indicated by S and G, respectively. Further, in FIG. 1, a p-type region (second second-conductivity-type region) 34b, of a non-operating region 1b of an active region 1 is indicated by a solid line, while an element structure of semiconductor elements 11 of the effective region 1a of the active region 1 are not depicted. FIGS. 2, 3, and 4 are examples of enlarged plan views near the gate pad in FIG. 1.

A semiconductor device 20 according to the first embodiment and depicted in FIG. 1 has the effective region 1a and the non-operating region 1b in the active region 1 of a semiconductor substrate (semiconductor chip) 10 containing silicon carbide. The effective region 1a of the active region 1 is a region in which a main current of the semiconductor elements 11 flows when the semiconductor elements 11 are ON. The semiconductor elements 11 are vertical MOSFETs having a trench gate structure. The effective region 1a of the active region 1, for example, has a substantially rectangular planar shape in which a portion thereof is recessed inwardly (toward a center portion of the active region 1) so as to surround the non-operating region 1b.

In the effective region 1*a* of the active region 1, on the front surface of the semiconductor substrate 10, the source pad 21*a* of the semiconductor elements 11 is provided spanning substantially the front surface of the semiconductor substrate 10 overall. A planar shape of the source pad 21*a*, for example, is substantially identical to a planar shape of the effective region 1*a* of the active region 1 and has a surface area smaller than that of the effective region 1*a* of the active region 1. Directly beneath the source pad 21*a*, plural unit cells (functional units of elements) of the semiconductor elements 11 are provided in the semiconductor substrate 10 (not depicted in FIGS. 1 to 4).

The non-operating region 1*b* of the active region 1 is a region that does not operate as the semiconductor elements 11 and in which no unit cell of the semiconductor elements 11 is disposed. The non-operating region 1*b* of the active region 1, for example, has a substantially rectangular planar shape in which a periphery of three sides thereof is surrounded by the effective region 1*a* and a remaining one side thereof opposes an edge termination region 2 described hereinafter. In the non-operating region 1*b* of the active region 1, the gate pad 21*b* of the semiconductor elements 11 is provided on the front surface of the semiconductor substrate 10, spanning substantially the front surface of the semiconductor substrate 10 overall.

Directly beneath the gate pad 21*b*, the p-type region 34*b*, is provided in a surface region of the front surface of the semiconductor substrate 10 spanning substantially the non-operating region 1*b* of the active region 1 overall. Where the non-operating region 1*b* of the active region 1 and the effective region 1*a* oppose each other, an outer peripheral portion of the p-type region 34*b*, opposes the source pad 21*a* in the direction (vertical direction) Z that is orthogonal to the front surface of the semiconductor substrate 10. The p-type region 34*b*, at a portion thereof opposing the source pad 21*a*, is electrically connected to the source pad 21*a*.

Further, the p-type region 34*b*, of the non-operating region 1*b* of the active region 1 is adjacent to a p-type base region (first second-conductivity-type region) 34*a* of the semiconductor elements 11 (refer to FIG. 5) extending from the effective region 1*a* of the active region 1 and is electrically connected to the p-type base region 34*a*. In FIGS. 2 to 4, trenches 37 extending from the effective region 1*a* of the active region 1 to the non-operating region 1*b* are indicated by thick lines. The trenches 37 may extend toward the non-operating region 1*b* and reach the p-type base region 34*a* of the semiconductor elements 11.

The p-type base region 34*a* of the semiconductor elements 11 is disposed between (mesa region) the trenches 37 that are adjacent to each other. The p-type base region 34*a* of the semiconductor elements 11 extends toward the non-operating region 1*b* and is separated from the p-type region 34*b*, of the non-operating region 1*b* by an n⁻-type region 32*a* described hereinafter (refer to FIG. 5). In FIGS. 1 to 4, an outer periphery of the p-type region 34*b*, of the non-operating region 1*b* is depicted while those of the p-type base region 34*a* of the semiconductor elements 11 and of the n⁻-type region 32*a* are not depicted.

The p-type region 34*b*, of the non-operating region 1*b* of the active region 1 has a substantially rectangular planar shape in which corner portions 81 are contoured. Near an interface between the effective region 1*a* and the non-operating region 1*b* of the active region 1, the p-type region 34*b*, of the non-operating region 1*b* of the active region 1 may have a substantially circular or elliptical planar shape provided design enables disposal of the p-type region 34*b*, the p-type base region 34*a*, and the trenches 37 so that the p-type region 34*b*, of the non-operating region 1*b* and the p-type base region 34*a* and the trenches 37 of the semiconductor elements 11 of the effective region 1*a* are in contact with each other.

Further, the p-type region 34*b*, of the non-operating region 1*b* of the active region 1, for example, is connected to a p-type region 34*c* directly beneath the gate runner 3, via a p-type region (hereinafter, p-type connecting portion) 34*d* disposed between the p-type regions 34*b*, 34*c* (FIGS. 2, 3). The source pad 21*a* (not depicted in FIG. 1), the p-type base region 34*a*, and the trenches 37 extend between the p-type regions 34*b*, 34*c*. The p-type region 34*b*, of the non-operating region 1*b* of the active region 1 may have, for example, one side in contact with and continuous entirely with the p-type region 34*c* directly beneath the gate runner 3 (FIG. 4).

The p-type region 34*b*, of the non-operating region 1*b* may be disposed as depicted in any of FIGS. 2 to 4 and corner portions 81, 81' of the p-type region 34*b*, are contoured. The corner portions 81, 81' of the p-type region 34*b*, are four vertices of the p-type region 34*b*, that has a rectangular planar shape. Contouring of the corner portions 81, 81' of the p-type region 34*b*, means that the corner portions 81, 81' of the p-type region 34*b*, are positioned further inward (toward a center portion of the p-type region 34*b*,) as compared to the substantially right-angle corner portions 231 of the p-type region 230 of the conventional semiconductor device 220 (refer to FIG. 16).

The corner portions 81, 81' of the p-type region 34*b*, of the non-operating region 1*b* of the active region 1 may be contoured to be rounded as a fillet (radius (R) contoured, refer to FIGS. 1, 2, 4) or contoured so as to form an obtuse angle (for example, chamfer (C) contoured, refer to FIG. 3). Further, ends 82, 82' (FIGS. 2, 3) of a connection site between the p-type regions 34*b*, 34*c* and the p-type connecting portion 34*d*, and ends 83 of a connection site between the p-type region 34*b*, and the p-type region 34*c* (FIG. 4) may be R contoured or C contoured so that portions forming right angles do not occur at outer periphery.

Even when portions (not contoured) forming right angles occur at the outer periphery, electric field substantially equal to that when the semiconductor elements 11 are OFF is applied to the ends 82, 82' of the connection site between the p-type regions 34*b*, 34*c* and the p-type connecting portion 34*d* and to the ends 83 of the connection site between the p-type region 34*b*, and the p-type region 34*c*. Therefore, the ends 82, 82', 83 of these connection sites need not be contoured. The p-type region 34*c* directly beneath the gate runner 3, similarly to the gate runner 3, is provided along a border between the active region 1 and the edge termination region 2 and surrounds a periphery of the active region 1.

A periphery of the active region 1 is surrounded by the edge termination region 2. The edge termination region 2 is a region between the active region 1 and an end of the semiconductor substrate 10. The edge termination region 2 mitigates electric field at a front surface side of the semiconductor substrate 10 and sustains breakdown voltage. In the edge termination region 2, for example, a voltage withstanding structure (not depicted) such as a field limiting ring (FLR) or junction termination extension (JTE) structure is disposed. The breakdown voltage is a voltage limit at which no errant operation or destruction of an element occurs.

Further, in the edge termination region 2, the gate runner 3 formed using poly-silicon (poly-Si) is provided. The gate runner 3 is electrically connected to the gate pad 21*b*. The gate runner 3, in the edge termination region 2, is disposed on a field oxide film (not depicted) covering the front surface of the semiconductor substrate 10. The gate runner 3 is provided along the border between the active region 1 and the edge termination region 2 and surrounds a periphery of the active region 1.

Figure 5:
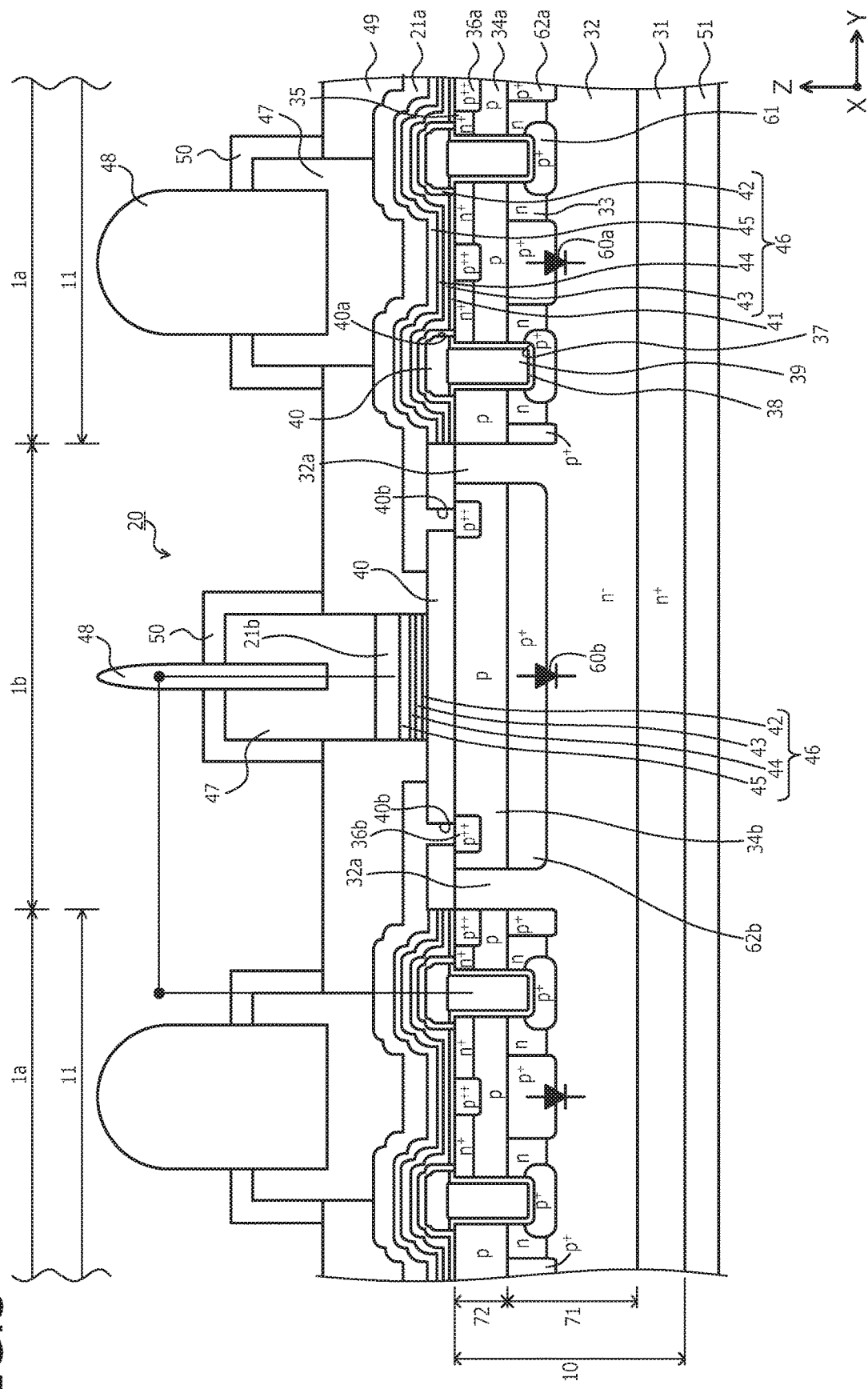
FIG. 5 is a cross-sectional view of a structure along cutting line A-A' in FIG. 1.

A structure of the semiconductor device according to the first embodiment will be described. FIG. 5 is a cross-sectional view of the structure along cutting line A-A' in FIG. 1. FIG. 5 depicts the structure along cutting line A-A' from the effective region 1a of the active region 1 in FIG. 1, through the non-operating region 1b, and again reaching the effective region 1a of the active region 1. As depicted in FIG. 5, the semiconductor substrate 10 is a semiconductor substrate in which silicon carbide layers 71, 72 forming an n$^-$-type drift region (first-conductivity-type region) 32 and the p-type base region 34a are formed by epitaxial growth on an n+-type starting substrate 31 containing silicon carbide.

In the effective region 1a of the active region 1, on the front surface side of the semiconductor substrate 10, parts configuring MOS gates of the semiconductor elements 11 are provided. The parts configuring the MOS gates of the main semiconductor elements 11 are the p-type base region 34a, an n$^+$-type source region 35, p$^{++}$-type contact regions 36a, the trenches 37, a gate insulating film 38, and the gate electrodes 39. The trenches 37 penetrate through the p-type silicon carbide layer 72 in the vertical direction Z from the front surface of the semiconductor substrate 10 (surface of the p-type silicon carbide layer 72) and reach the n$^-$-type silicon carbide layer 71.

The trenches 37, for example, are disposed in a striped shape extending in a direction (hereinafter, first direction: a horizontal direction) X parallel to the front surface of the semiconductor substrate 10 or a direction (hereinafter, second direction: a horizontal direction) Y orthogonal to the first direction X. In FIGS. 2 to 4, a case in which the trenches 37 are disposed in a striped shape extending in the first direction X is depicted. In the trenches 37, the gate electrodes 39 are provided via the gate insulating film 38. Between (mesa region) the trenches 37 that are adjacent to each other, an n-type region (hereinafter, n-type current spreading region) 33 may be provided in contact with the p-type base region 34a.

The n-type current spreading region 33 is a so-called current spreading layer (CSL) that reduces carrier spreading resistance. The n-type current spreading region 33, from an interface with the p-type base region 34a, reaches a position closer to an n$^+$-type drain region (the n$^+$-type starting substrate 31) than are bottoms of the trenches 37. Further, in the n$^-$-type silicon carbide layer 71, first and second p$^+$-type regions 61, 62a may be selectively provided.

The first p$^+$-type regions 61 are provided separated from the p-type base region 34a and oppose the bottoms of the trenches 37 in the vertical direction Z, respectively. The second p$^+$-type regions 62a are each disposed in a mesa region, separated from the first p$^+$-type regions 61 and the trenches 37, and in contact with the p-type base region 34a. The first and the second p$^+$-type regions 61, 62a have a function of mitigating electric field applied to the gate insulating film 38 at the bottoms of the trenches 37. Between the n$^+$-type drain region and the n-type current spreading region 33 and the first and the second p$^+$-type regions 61, 62a, the n$^-$-type drift region 32 is provided in contact with these regions.

The p-type base region 34a, the n$^+$-type source region 35, and the p$^{++}$-type contact regions 36a are selectively provided in the p-type silicon carbide layer 72. The n$^+$-type source region 35 and the p$^{++}$-type contact regions 36a are provided between the front surface of the semiconductor substrate 10 and the p-type base region 34a. Each n$^+$-type source region 35 is in contact with the gate insulating film 38 at a side wall of one of the trenches 37 and opposes the gate electrode 39, across the gate insulating film 38. An interlayer insulating film 40 is provided on the front surface of the semiconductor substrate 10 overall so as to cover the gate electrodes 39.

The gate electrodes 39 of all the main semiconductor elements 11, at a non-depicted portion, are electrically connected to the gate pad 21b (refer to FIG. 1) via the gate runner 3 (refer to FIG. 1) formed using, for example, poly-silicon. In the interlayer insulating film 40, first contact holes 40a that penetrate through the interlayer insulating film 40 in the vertical direction Z and reach the front surface of the semiconductor substrate 10 is provided. The n$^+$-type source region 35 and the p$^{++}$-type contact regions 36a of the main semiconductor elements 11 are exposed by the first contact holes 40a.

In the first contact holes 40a, on the front surface of the semiconductor substrate 10, a nickel silicide (NiSi, Ni$_2$Si or thermally stable NiSi$_2$, hereinafter, collectively NiSi) film 41 is provided. The NiSi film 41 in each of the first contact holes 40a forms an ohmic contact with the semiconductor substrate 10 and is electrically connected to the n$^+$-type source region 35 and the p$^{++}$-type contact regions 36a.

In the effective region 1a of the active region 1, a barrier metal 46 is provided on surfaces of the interlayer insulating film 40 and of the NiSi films 41 overall. The barrier metal 46 has a function of preventing interaction between metal films of the barrier metal or between regions sandwiching the barrier metal. The barrier metal 46 may have, for example, a stacked structure in which a first titanium nitride (TiN) film 42, a first titanium (Ti) film 43, a second TiN film 44, and a second Ti film 45 are sequentially stacked.

The first TiN film 42 is provided only on the surface of the interlayer insulating film 40 and covers the surface of the interlayer insulating film 40 entirely. The first Ti film 43 is provided on surfaces of the first TiN film 42 and of the NiSi film 41. The second TiN film 44 is provided on the surface of the first Ti film 43. The second Ti film 45 is provided on the surface of the second TiN film 44.

The source pad 21a is embedded in the first contact holes 40a and provided on the surface of the second Ti film 45 overall. The source pad 21a is electrically connected to the n$^+$-type source region 35 and the p$^{++}$-type contact regions 36a via the barrier metal 46 and the NiSi film 41, and functions as a source electrode of the main semiconductor elements 11a. The source pad 21a is, for example, an aluminum (Al) film or an aluminum alloy film.

In particular, when the source pad 21a is an aluminum alloy film, the source pad 21a, for example, may be an aluminum-silicon (Al-Si) film containing at most about 5% silicon in total, may be an aluminum-silicon-copper (Al-Si-Cu) film containing at most about 5% silicon in total and at most about 5% copper (Cu) in total, or may be an aluminum-copper (Al-Cu) film containing at most 5% copper in total.

First ends of terminal pins 48 are bonded on the source pad 21a via plating films 47 and solder layers (not depicted). Second ends of the terminal pins 48 are bonded to a metal bar (not depicted) disposed so as to oppose the front surface of the semiconductor substrate 10. Further, the second ends of the terminal pins 48 are exposed outside a case (not depicted) in which the semiconductor substrate 10 is mounted and are electrically connected to an external device (not depicted).

The terminal pins 48 are wiring members having a round bar-like (cylindrical) shape of a predetermined diameter. The terminal pins 48 are soldered to the plating films 47 in a substantially vertical state with respect to the front surface of the semiconductor substrate 10. The terminal pins 48 are external connection terminals that lead out electric potential of the source pad 21a to an external destination. Via the terminal pins 48, the source pad 21a is connected to an external ground potential (minimum electric potential).

The plating films 47 are formed using a material that is highly adhesive to the source pad 21a and compared to wire bonding is not likely to peel even under high-temperature conditions (for example, 200 degrees C. to 300 degrees C.). A portion of the surface of the source pad 21a other than portions having the plating films 47 is covered by a first protective film 49. Borders between the plating films 47 and the first protective film 49 are covered by second protective films 50. The first and the second protective films 49, 50 are, for example, polyimide films.

Further, in the non-operating region 1b of the active region 1, the gate pad 21b is provided on the front surface of the semiconductor substrate 10 via the interlayer insulating film 40. The first TiN film 42, the first Ti film 43, the second TiN film 44, and the second Ti film 45 of the barrier metal 46 may be provided between the gate pad 21b and the interlayer insulating film 40. On the gate pad 21b, similarly to the terminal pins 48 on the source pad 21a, the first ends of the terminal pins 48 are bonded via the plating film 47 and a solder layer (not depicted).

The second ends of the terminal pins 48 on the gate pad 21b, similarly to the terminal pins 48 on the source pad 21a, are bonded to a metal bar (not depicted) disposed so as to oppose the front surface of the semiconductor substrate 10. A quantity and diameter of the terminal pins 48 bonded on the gate pad 21b may respectively differ from a quantity and diameter of the terminal pins 48 bonded on the source pad 21a.

Directly beneath the gate pad 21b, in a surface region of the front surface of the semiconductor substrate 10, the p-type region 34b, is selectively provided sandwiching the interlayer insulating film 40 with the gate pad 21b. The p-type region 34b, of the non-operating region 1b extends closer to the effective region 1a of the active region 1 in a direction (the first and the second directions X, Y) parallel to the front surface of the semiconductor substrate 10 than does the gate pad 21b.

In the p-type region 34b, a $p^{++}$-type contact region (third second-conductivity-type region) 36b may be selectively provided. The $p^{++}$-type contact region 36b has a substantially rectangular planar shape surrounding a center portion of the p-type region 34b and is provided along an outer periphery of the p-type region 34b. Corner portions (four vertices (not depicted) of the substantially rectangular shape) of the $p^{++}$-type contact region 36b are contoured similarly to the corner portions 81 of the p-type region 34b. The $p^{++}$-type contact region 36b, in the vertical direction Z, opposes the source pad 21a and does not oppose the gate pad 21b.

The corner portions of the $p^{++}$-type contact region 36b are contoured similarly to the corner portions 81 of the p-type region 34b and therefore, a distance in a direction parallel to the front surface of the semiconductor substrate 10, from an outer periphery of the p-type region 34b to a contact (electrical contact portion) between the $p^{++}$-type contact region 36b and the source pad 21a is constant around the entire outer periphery of the p-type region 34b. As a result, an effect of suppressing electron hole current concentration at the corner portions 81 of the p-type region 34b described hereinafter increases.

The $p^{++}$-type contact region 36b, similarly to the $p^{++}$-type contact regions 36a of the semiconductor elements 11, in a second contact hole 40b, form an ohmic contact with the NiSi film 41 and are electrically connected to the source pad 21a via the NiSi film 41 and the barrier metal 46. In FIG. 5, the NiSi film 41 and the barrier metal 46 of the second contact hole 40b are not depicted.

Between the p-type region 34b and the $n^-$-type drift region 32, a second $p^+$-type region 62b may be provided in contact with these regions. The p-type region 34b, the $p^{++}$-type contact region 36b, and the second $p^+$-type region 62b, for example, have depths and impurity concentrations similar to those of the p-type base region 34a, the $p^{++}$-type contact regions 36a, and the second $p^+$-type regions 62a of the semiconductor elements 11, respectively.

Between the effective region 1a and the non-operating region 1b of the active region 1, in a surface region of the front surface of the semiconductor substrate 10, the $n^-$-type region 32a is provided. The p-type region 34b and the second $p^+$-type region 62b of the non-operating region 1b are separated from the p-type base region 34a and the second $p^+$-type regions 62a of the effective region 1a by the $n^-$-type region 32a. The p-type region 34b and the second $p^+$-type region 62b of the non-operating region 1b may partially contact the p-type base region 34a and the second $p^+$-type regions 62a of the effective region 1a.

A drain electrode 51 forms an ohmic contact at a back surface (back surface of the $n^+$-type starting substrate 31) of the semiconductor substrate 10 overall. On the drain electrode 51, a drain pad (electrode pad, not depicted) is provided. The drain pad has a stacked structure in which, for example, a Ti film, a nickel (Ni) film, and a gold (Au) film are sequentially stacked. Thicknesses of the Ti film, the Ni film and the Au film configuring the drain pad, for example, may be 20 μm, 100 μm, and 2 μm, respectively.

The drain pad is soldered to a metal base plate (not depicted) and is in contact with at least a portion of a base portion of a cooling fin (not depicted) via the metal base plate. The semiconductor substrate 10 includes a double-sided cooling structure. In other words, heat generated at the semiconductor substrate 10 is radiated from a fin portion of the cooling fin in contact with a back surface of the semiconductor substrate 10 via the metal base plate and is radiated from the metal bar to which the terminal pins 48 of the front surface of the semiconductor substrate 10 are bonded.

Operation of the semiconductor device 20 according to the first embodiment will be described. In a state in which voltage that is positive with respect to the source electrode (the source pad 21a) of the semiconductor elements 11 is applied to the drain electrode 51, when voltage at least equal to a threshold voltage is applied to the gate electrodes 39, an n-type inversion layer (channel) is formed in a portion of the p-type base region 34a sandwiched between the $n^+$-type source region 35 and the n-type current spreading region 33. As a result, from the $n^+$-type drain region (the $n^+$-type starting substrate 31), current flows along a path of the $n^-$-type drift region 32, the n-type current spreading region 33, a surface inversion layer of the p-type base region 34a, and the $n^+$-type source region 35, and the semiconductor elements 11 turns ON.

On the other hand, when voltage lower than the threshold voltage is applied to the gate electrodes 39, pn junctions between the first and the second $p^+$-type regions 61, 62a and the n-type current spreading region 33 and the n⁻-type drift region 32 are reverse biased and current does not flow. As a result, the semiconductor elements 11 maintain the OFF state. In this manner, when the semiconductor elements 11 switch from ON to OFF, in the effective region 1a of the active region 1, a parasitic diode 60a is formed by pn junctions between the p-type base region 34a, the first and the second p⁺-type regions 61, 62a and the n-type current spreading region 33 and the n⁻-type drift region 32.

Further, as described above, the p-type region 34b is electrically connected to the source pad 21a and has the source electric potential, whereby when the semiconductor elements 11 switch from ON to OFF, in the non-operating region 1b of the active region 1 as well, a parasitic diode 60b is formed by pn junctions between the p-type region 34b and the second p⁺-type region 62b and the n⁻-type drift region 32. In the edge termination region 2 as well, a parasitic diode is formed by a pn junction between the p-type region 34c and the n⁻-type drift region 32. These parasitic diodes turn OFF when the semiconductor elements 11 switch from OFF to ON.

When the parasitic diodes 60a, 60b of the active region 1 turn OFF, electron holes (holes) in the n⁻-type drift region 32 are pulled out from the p-type base region 34a and the p-type region 34b to the source pad 21a. Near the non-operating region 1b of the active region 1, the amount of electron hole current passing through the p-type region 34b of the non-operating region 1b to the source pad 21a is greater than the amount of electron hole current (reverse recovery current of the parasitic diodes 60a, 60b) passing through the p-type base region 34a of the effective region 1a to the source pad 21a. Therefore, electron hole current concentrates more at the p-type region 34b of the non-operating region 1b than at the p-type base region 34a of the effective region 1a.

In the conventional semiconductor device 220 (refer to FIG. 16), electron hole current concentrates at the substantially right-angle corner portions 231 of the p-type region 230 of the non-operating region 201b of the active region 201. On the other hand, in the first embodiment, as described above, the corner portions 81 of the p-type region 34b of the non-operating region 1b of the active region 1 are contoured, whereby the electron hole current flowing into the p-type region 34b is substantially constant along the outer periphery of the p-type region 34b overall and does not concentrate at the corner portions 81 of the p-type region 34b. Therefore, local increases in the electric field at the corner portions 81 of the p-type region 34b of the non-operating region 1b of the active region 1 may be prevented.

A method of manufacturing the semiconductor device 20 according to the first embodiment will be described. FIGS. 6, 7, 8, 9, 10, and 11 are cross-sectional views of the semiconductor device according to the first embodiment during manufacture. In FIGS. 6 to 11, only the semiconductor elements 11 of the effective region 1a of the active region 1 are depicted. Refer to FIG. 1 regarding the non-operating region 1b of the active region 1.

Figure 6:
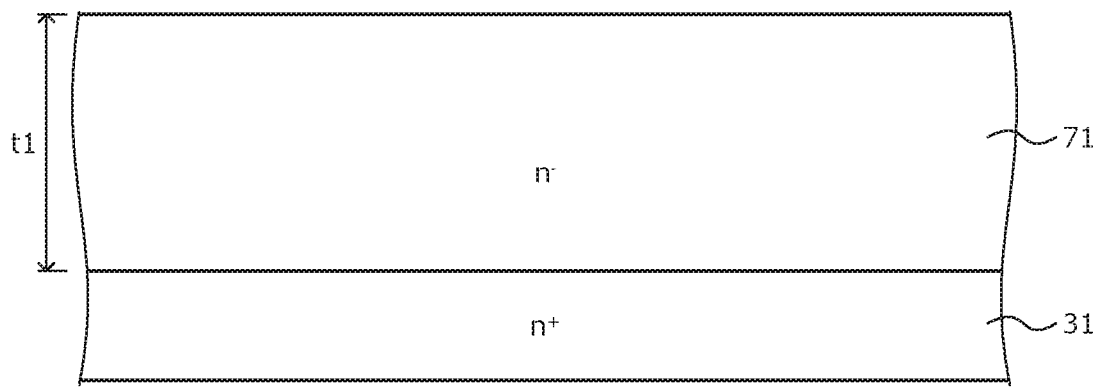
FIG. 6 is a cross-sectional view of the semiconductor device according to the first embodiment during manufacture.

First, as depicted in FIG. 6, the n⁺-type starting substrate (semiconductor wafer) 31 containing silicon carbide is prepared. The n⁺-type starting substrate 31, for example, may be a silicon carbide single-crystal substrate doped with nitrogen (N). Next, on a front surface of the n⁺-type starting substrate 31, the n⁻-type silicon carbide layer 71 is formed by epitaxial growth and doped with nitrogen at a concentration lower than a concentration of the n⁺-type starting substrate 31. When a breakdown voltage of the semiconductor elements 11 is 3300V, a thickness t1 of the n⁻-type silicon carbide layer 71 may be, for example, about 30 μm.

Figure 7:
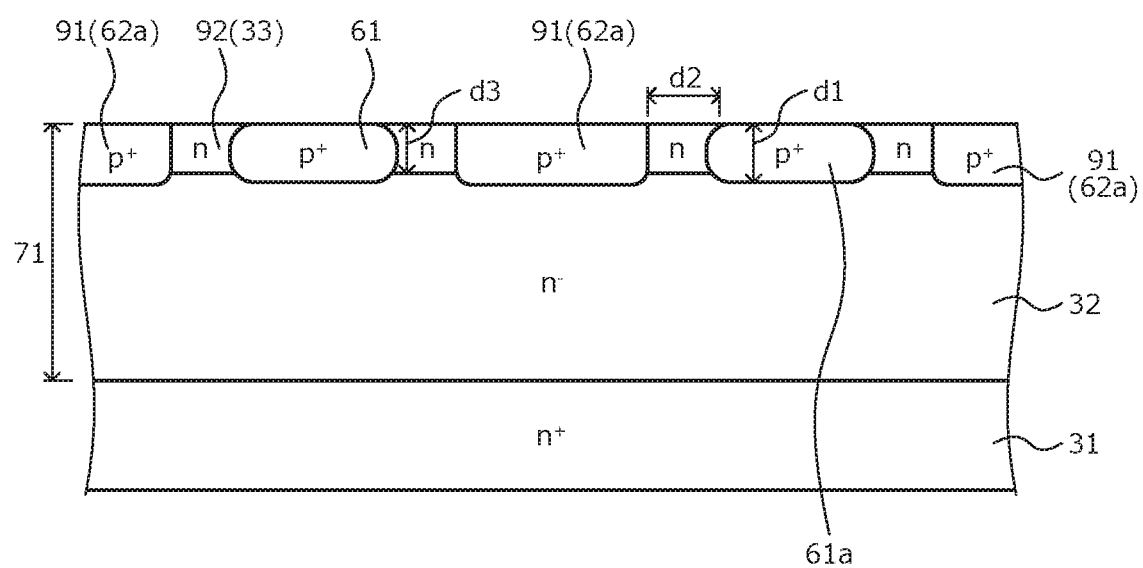
FIG. 7 is a cross-sectional view of the semiconductor device according to the first embodiment during manufacture.

Next, as depicted in FIG. 7, by photolithography and ion implantation of, for example, a p-type impurity such as Al, in the effective region 1a of the active region 1 (refer to FIG. 1), the first p⁺-type regions 61 and p⁺-type regions 91 are selectively formed in surface regions of the n⁻-type silicon carbide layer 71. The p⁺-type regions 91 are a part of the second p⁺-type regions 62a. The first p⁺-type regions 61 and the p⁺-type regions 91 are disposed repeatedly alternating each other along a direction (for example, the first direction X or the second direction Y in FIG. 1) parallel to the front surface of the n⁺-type starting substrate 31.

The first p⁺-type regions 61 and the p⁺-type regions 91, for example, are disposed in a striped shape extending along the second direction Y or the first direction X in FIG. 1. A distance d2 between each first p⁺-type region 61 and each p⁺-type region 91 adjacent to each other may be, for example, about 1.5 μm. A depth d1 and impurity concentration of the first p⁺-type regions 61 and the p⁺-type regions 91 may be, for example, about 0.5 μm and about $5.0 \times 10^{18}$/cm³, respectively. Subsequently, an ion implantation mask (not depicted) used in forming the first p⁺-type regions 61 and the p⁺-type regions 91 is removed.

Next, by photolithography and ion implantation of, for example, an n-type impurity such as nitrogen, spanning the effective region 1a of the active region 1 overall, n-type regions 92 are formed in surface regions of the n⁻-type silicon carbide layer 71. Each n-type region 92, for example, between each first p⁺-type region 61 and each p⁺-type region 91 adjacent to each other, is formed so as to be in contact with these regions. A depth d3 and impurity concentration of the n-type regions 92 may be, for example, about 0.4 μm and about $1.0 \times 10^{17}$/cm³, respectively.

The n-type regions 92 are a part of the n-type current spreading region 33. A portion of the n⁻-type silicon carbide layer 71 sandwiched between the n⁺-type starting substrate 31 and, the n-type regions 92, the first p⁺-type regions 61 and the p⁺-type regions 91 becomes the n⁻-type drift region 32. Subsequently, an ion implantation mask (not depicted) used in forming the n-type regions 92 is removed. A formation sequence of the n-type regions 92 and, the first p⁺-type regions 61 and the p⁺-type regions 91 may be interchanged.

Figure 8:
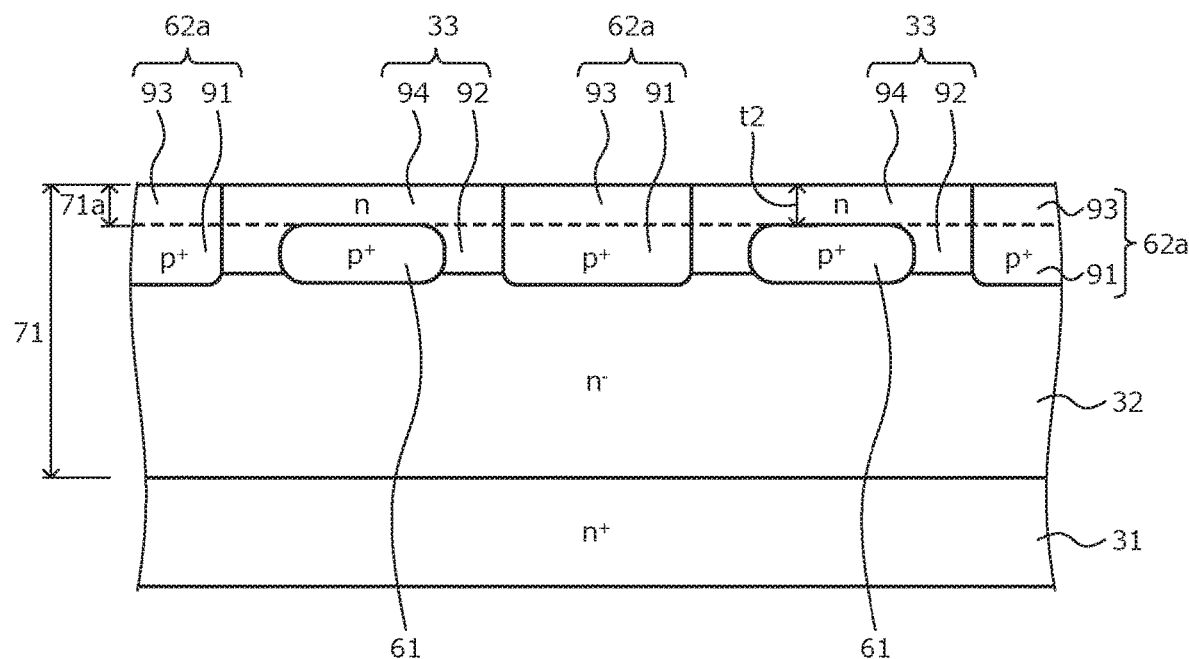
FIG. 8 is a cross-sectional view of the semiconductor device according to the first embodiment during manufacture.

Next, as depicted in FIG. 8, on the n⁻-type silicon carbide layer 71, an n⁻-type silicon carbide layer doped with, for example, n-type impurity such as nitrogen is formed by epitaxial growth to have a thickness t2 of, for example, about 0.5 μm and thereby, increases the thickness of the n⁻-type silicon carbide layer 71. An impurity concentration of a portion 71a increasing the thickness of the n⁻-type silicon carbide layer 71 may be equal to an impurity concentration of a portion of the n⁻-type silicon carbide layer 71 between the portion 71a increasing the thickness and the n⁺-type starting substrate 31.

Next, by photolithography and ion implantation of a p-type impurity such as Al, at portions of the portion 71a increasing the thickness of the n⁻-type silicon carbide layer 71, the portions opposing the p⁺-type regions 91 in a depth direction, p⁺-type regions 93 are selectively formed at a depth reaching the p⁺-type regions 91. The p⁺-type regions 91, 93 are connected to each other in the depth direction, whereby the second p⁺-type regions 62a are formed. A width and impurity concentration of the p⁺-type regions 93 are, for example, substantially equal to those of the p⁺-type regions 91. Subsequently, an ion implantation mask (not depicted) used in forming the p⁺-type regions 93 is removed.

Next, by photolithography and ion implantation of, for example, an n-type impurity such as nitrogen, in the portion 71a increasing the thickness of the n⁻-type silicon carbide layer 71, between the p⁺-type regions 93 that are adjacent to each other in the effective region 1a of the active region 1, n-type regions 94 are formed at a depth reaching the n-type regions 92. An impurity concentration of the n-type regions 94 is substantially equal to, for example, an impurity concentration of the n-type regions 92. The n-type regions 92, 94 are connected to each other in the depth direction, whereby the n-type current spreading region 33 is formed. A formation sequence of the p⁺-type regions 93 and the n-type regions 94 may be interchanged. Subsequently, an ion implantation mask (not depicted) used in forming the n-type regions 94 is removed.

Figure 9:
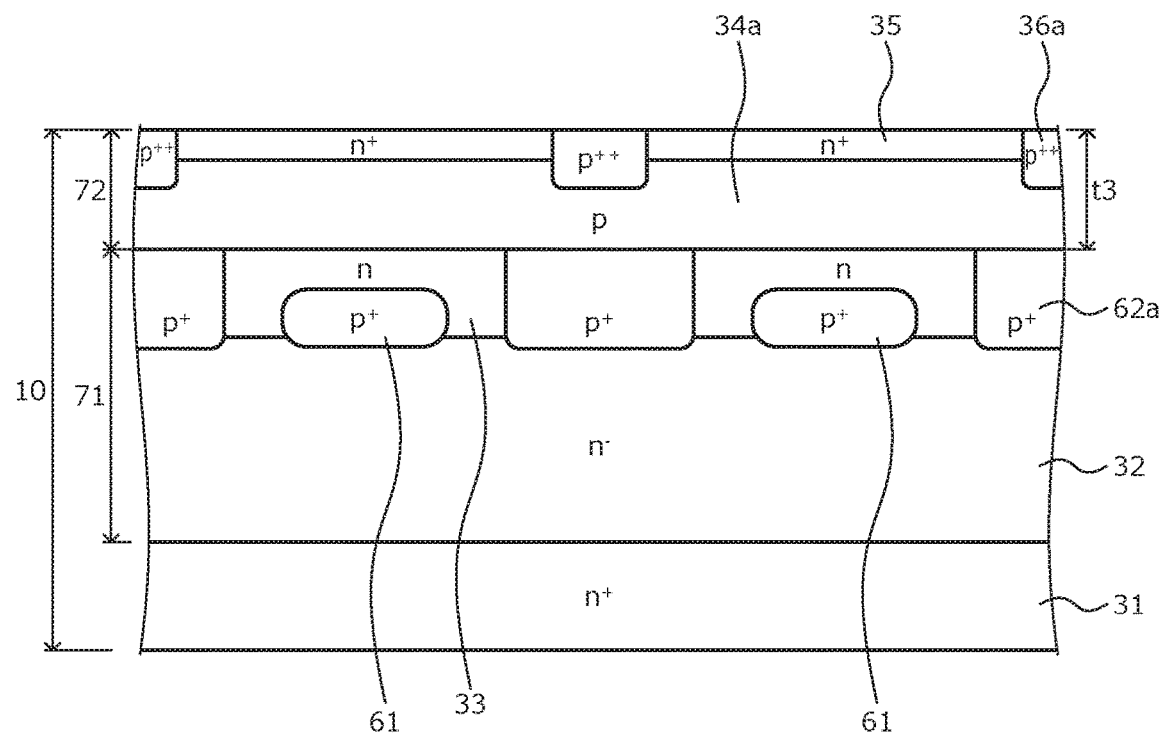
FIG. 9 is a cross-sectional view of the semiconductor device according to the first embodiment during manufacture.

Next, as depicted in FIG. 9, on the n⁻-type silicon carbide layer 71, the p-type silicon carbide layer 72 is formed by epitaxial growth and doped with, for example, a p-type impurity such as Al. A thickness t3 and impurity concentration of the p-type silicon carbide layer 72 may be, for example, about 1.3 μm and about $4.0 \times 10^{17}/cm^3$, respectively. As a result, the semiconductor substrate 10 is formed in which the n⁻-type silicon carbide layer 71 and the p-type silicon carbide layer 72 are sequentially stacked on the n⁺-type starting substrate 31 by epitaxial growth.

Next, by photolithography and ion implantation of, for example, an n-type impurity such as phosphorus (P), in the effective region 1a of the active region 1, the n⁺-type source region 35 is selectively formed in a surface region of the p-type silicon carbide layer 72. Subsequently, an ion implantation mask used in forming the n⁺-type source region 35 is removed.

Next, by photolithography and ion implantation of a p-type impurity such as Al, in the effective region 1a of the active region 1, the p⁺⁺-type contact regions 36a are selectively formed in surface regions of the p-type silicon carbide layer 72. Subsequently, an ion implantation mask used in forming the p⁺⁺-type contact regions 36a is removed.

Next, by photolithography and ion implantation of, for example, an n-type impurity such as phosphorus, near a border between the effective region 1a and the non-operating region 1b of the active region 1, the n⁻-type region 32a (refer to FIG. 5) is formed that penetrates through the p-type silicon carbide layer 72 in the vertical direction Z and reaches the n⁻-type silicon carbide layer 71. The effective region 1a and the non-operating region 1b of the active region 1 are separated from each other by the n⁻-type region 32a. Subsequently, an ion implantation mask used in forming the n⁻-type region 32a is removed.

A formation sequence of the n⁺-type source region 35, the p⁺⁺-type contact regions 36a, and the n⁻-type region 32a may be interchanged. In the effective region 1a of the active region 1, a portion sandwiched between the n⁻-type silicon carbide layer 71 and the n⁺-type source region 35 and the p⁺⁺-type contact regions 36a becomes the p-type base region 34a. In the ion implantations above, for example, resist films and/or oxide films may be used as the ion implantation masks.

Further, a diffusion region of the non-operating region 1b of the active region 1 suffices to be formed concurrently with a diffusion region that, of diffusion regions configuring the semiconductor elements 11, has a conductivity type, an impurity concentration, and a diffusion depth respectively identical thereto. In particular, in the non-operating region 1b of the active region 1, the p-type region 34b, the p⁺⁺-type contact region 36b, and the second p⁺-type region 62b suffice to be formed concurrently with the p-type base region 34a of the semiconductor elements 11, the p⁺⁺-type contact regions 36a, and the second p⁺-type regions 62a, respectively.

Next, for all diffusion regions (the first p⁺-type regions 61, the second p⁺-type regions 62a, 62b, the n-type current spreading region 33, the n⁺-type source region 35, the p⁺⁺-type contact regions 36a, 36b, and the n⁻-type region 32a) formed by ion implantation, a heat treatment (activation annealing) for activating impurities is performed, for example, at a temperature of about 1700 degrees C. for about 2 minutes. The activation annealing may be performed one time collectively after all the diffusion regions are formed or may be performed each time a diffusion region is formed by ion implantation.

Figure 10:
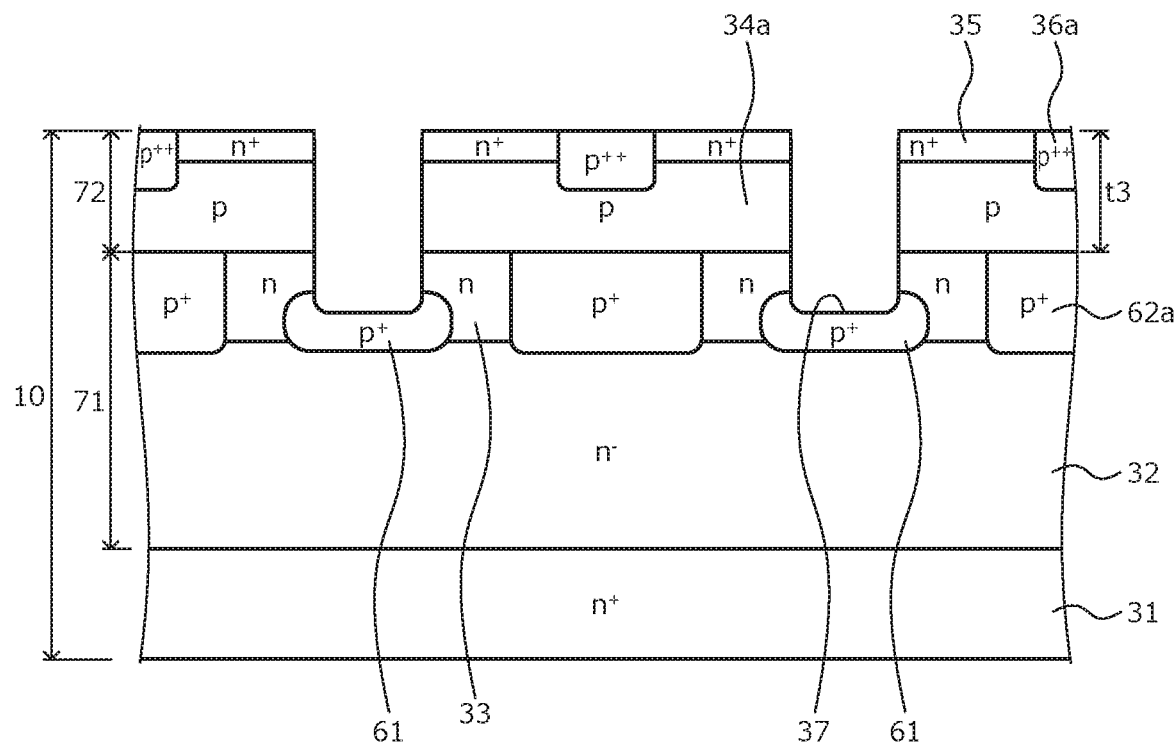
FIG. 10 is a cross-sectional view of the semiconductor device according to the first embodiment during manufacture.

Next, as depicted in FIG. 10, by photolithography and, for example, dry etching, the trenches 37 are formed penetrating through the n⁺-type source region 35 and the p-type base region 34a, and reaching the first p⁺-type regions 61 in the n-type current spreading region 33. As an etching mask for forming the trenches 37, for example, a resist film or an oxide film may be used.

Figure 11:
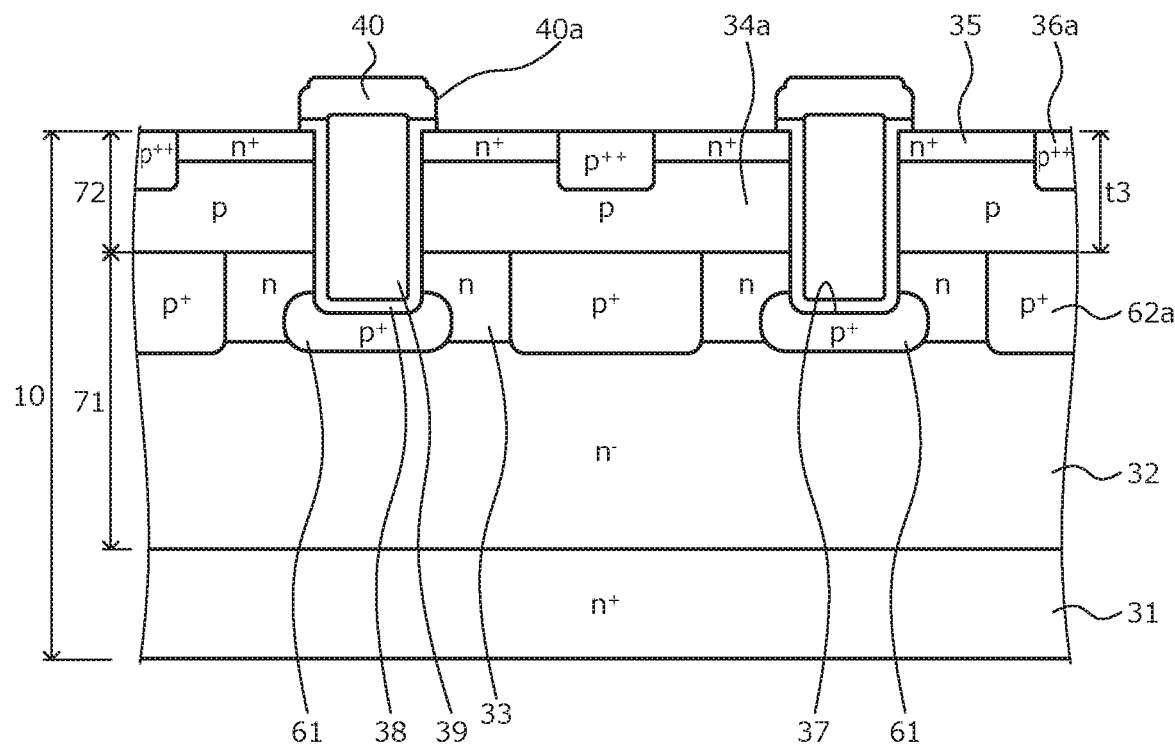
FIG. 11 is a cross-sectional view of the semiconductor device according to the first embodiment during manufacture.

Next, as depicted in FIG. 11, along the surface of the semiconductor substrate 10 and inner walls of the trenches 37, the gate insulating film 38 is formed. The gate insulating film 38 may be formed by, for example, thermal oxidation in an oxygen ($O_2$) atmosphere, at a temperature of about 1000 degrees C. Further, the gate insulating film 38 may be a deposited film obtained by a chemical reaction such as a high temperature oxide (HTO).

Next, for example, a poly-silicon layer doped with phosphorus is deposited on the gate insulating film 38 so as to be embedded in the trenches 37 and is patterned leaving only portions thereof in the trenches 37 as the gate electrodes 39. Here, the portions of the poly-silicon layer becoming the gate electrodes 39 may be left so as to protrude outwardly from the front surface of the semiconductor substrate 10 or may be left so as to be lower than the front surface of the semiconductor substrate 10.

Next, in the edge termination region 2, the field insulating film (not depicted) is formed on the front surface of the semiconductor substrate 10. Next, on the field insulating film, a poly-silicon layer is deposited and patterned leaving in the edge termination region 2, a portion thereof forming the gate runner.

Next, on the front surface of the semiconductor substrate 10 overall, the interlayer insulating film 40 is formed so as to cover the gate electrodes 39 and the gate runner. The interlayer insulating film 40 may be, for example, a phosphosilicate glass (PSG). A thickness of the interlayer insulating film 40 may be, for example, about 1 μm.

Next, by photolithography and etching, the interlayer insulating film 40 and the gate insulating film 38 are selectively removed to form the first and the second contact holes 40a, 40b. The n⁺-type source region 35 and the p⁺⁺-type contact regions 36a of the semiconductor elements 11 are exposed by the first contact holes 40a. The p⁺⁺-type contact region 36b is exposed by the second contact hole 40b. Next, the interlayer insulating film 40 is planarized (reflow) by a heat treatment.

Next, for example, by sputtering, on the front surface of the semiconductor substrate 10 overall, the first TiN film 42 becoming a barrier metal is formed. The first TiN film 42 covers the entire surface of the interlayer insulating film 40 and portions (the n⁺-type source region 35 and the p⁺⁺-type contact regions 36a, 36b) of the front surface of the semiconductor substrate 10 exposed by the first and the second contact holes 40a, 40b.

Next, by photolithography and etching, portions of the first TiN film 42 covering the semiconductor substrate 10 in the first and the second contact holes 40a, 40b are removed, again exposing the n⁺-type source region 35 and the p⁺⁺-type contact regions 36a, 36b. As a result, the first TiN film 42 remains on the entire surface of the interlayer insulating film 40.

Next, for example, by sputtering, a Ni film (not depicted) is formed on semiconductor portions (the front surface of the semiconductor substrate 10) exposed by the first and the second contact holes 40a, 40b. Here, the Ni film is formed on the first TiN film 42 as well. Next, by a heat treatment of, for example, about 970 degrees C., portions of the Ni film in contact with the semiconductor portions are converted into a silicide, thereby forming the NiSi film 41 that forms an ohmic contact with the n⁺-type source region 35 and the p⁺⁺-type contact regions 36a, 36b of the semiconductor elements 11.

During the heat treatment for converting nickel into a silicide, the first TiN film 42 is disposed between the interlayer insulating film 40 and the Ni film, thereby enabling nickel atoms in the Ni film to be prevented from diffusing into the interlayer insulating film 40. A portion of the Ni film on the interlayer insulating film 40 is not in contact with the semiconductor portions and therefore, is not converted into a silicide. The portion of the Ni film on the interlayer insulating film 40 is removed, exposing the interlayer insulating film 40.

Next, on the back surface of the semiconductor substrate 10, for example, a Ni film is formed. Next, by a heat treatment of, for example, about 970 degrees C., the Ni film is converted into a silicide, forming, as the drain electrode 51, a NiSi film that forms an ohmic contact with a semiconductor portion (the back surface of the semiconductor substrate 10). The heat treatment for silicide conversion when the NiSi film becoming the drain electrode 51 is formed may be performed concurrently with a heat treatment for forming the NiSi film 41 of the front surface of the semiconductor substrate 10.

Next, by sputtering, the first Ti film 43, the second TiN film 44, and the second Ti film 45 becoming the barrier metal 46 are sequentially stacked on the front surface of the semiconductor substrate 10. Formation of the NiSi film 41 and the barrier metal 46 is performed in a state in which portions of the non-operating region 1b of the active region 1 overall other than the p⁺⁺-type contact region 36b (the second contact hole 40b) are covered by the interlayer insulating film 40. Next, the interlayer insulating film 40 is planarized by a heat treatment.

Next, on the front surface of the semiconductor substrate 10, an Al film or an aluminum alloy film (hereinafter, collectively Al film) becoming the source pad 21a and the gate pad 21b are stacked so as to be embedded in the first and the second contact holes 40a, 40b. A thickness of the Al film is, for example, at most about 5 μm. Next, by photolithography and etching, the metal films 41 to 45 and the Al film are patterned, leaving portions thereof becoming the barrier metal 46, the source pad 21a, and the gate pad 21b.

Next, for example, by sputtering, for example, a Ti film, a Ni film, and a gold (Au) film are sequentially stacked on the surface of the drain electrode 51, thereby forming the drain pad (not depicted). Next, for example, by CVD, the front surface of the semiconductor substrate 10 is protected by a polyimide film that forms the first protective film 49. Next, by photolithography and etching, the polyimide film is selectively removed, exposing the source pad 21a and the gate pad 21b in different openings.

Next, after a general plating pretreatment, the plating films 47 are formed on the surface of the source pad 21a by a general plating process. Here, the first protective film 49 functions as a mask that suppresses wet spreading of the plating films 47. A thickness of the plating films 47 may be, for example, about 5 μm. Next, for example, by CVD, polyimide films that become the second protective films 50 covering borders thereof with the plating films 47 and the first protective film 49 are formed.

Next, on the plating films 47, the terminal pins 48 are bonded by solder layers (not depicted). Here, the second protective films 50 function as masks that suppress wet spreading the solder layer. Thereafter, the semiconductor substrate 10 is diced (cut) into individual chips, whereby the semiconductor device 20 depicted in FIG. 1 is completed.

As described above, according to the first embodiment, when the parasitic diode formed by the pn junction between the n⁻-type drift region and the p-type region of the non-operating region of the active region turns OFF, electron hole current that passes through the p-type region of the non-operating region of the active region and out to the source pad does not concentrate at the corner portions of the p-type region. As a result, local increases in electric field at the corner portions of the p-type region of the non-operating region of the active region may be prevented and reverse recovery capability of the parasitic diode may be enhanced, thereby enabling dielectric breakdown near the corner portions of the p-type region of the non-operating region of the active region to be suppressed.

Figure 12:
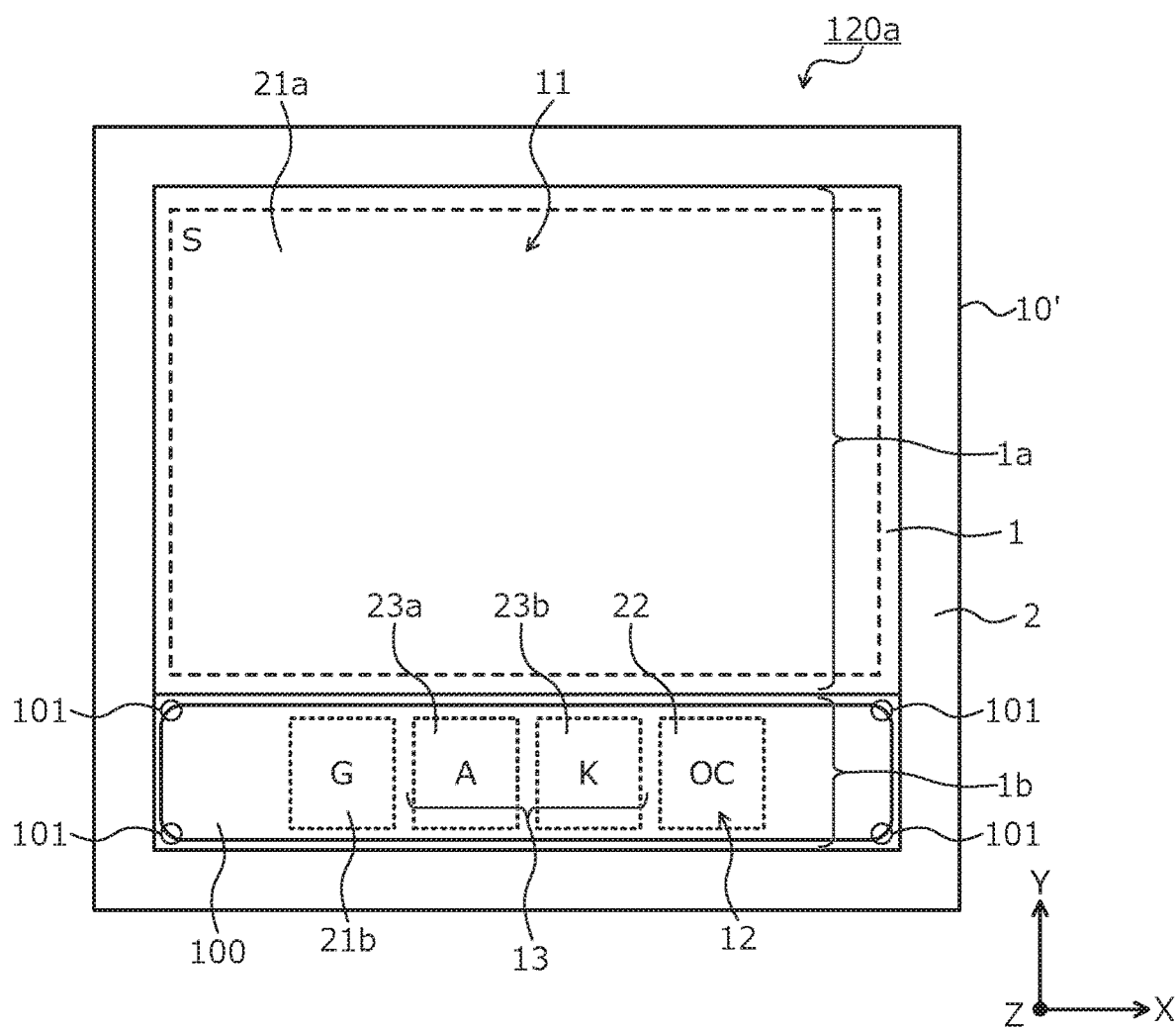
FIG. 12 is a cross-sectional view of a structure of the semiconductor device according to a second embodiment.
Figure 13:
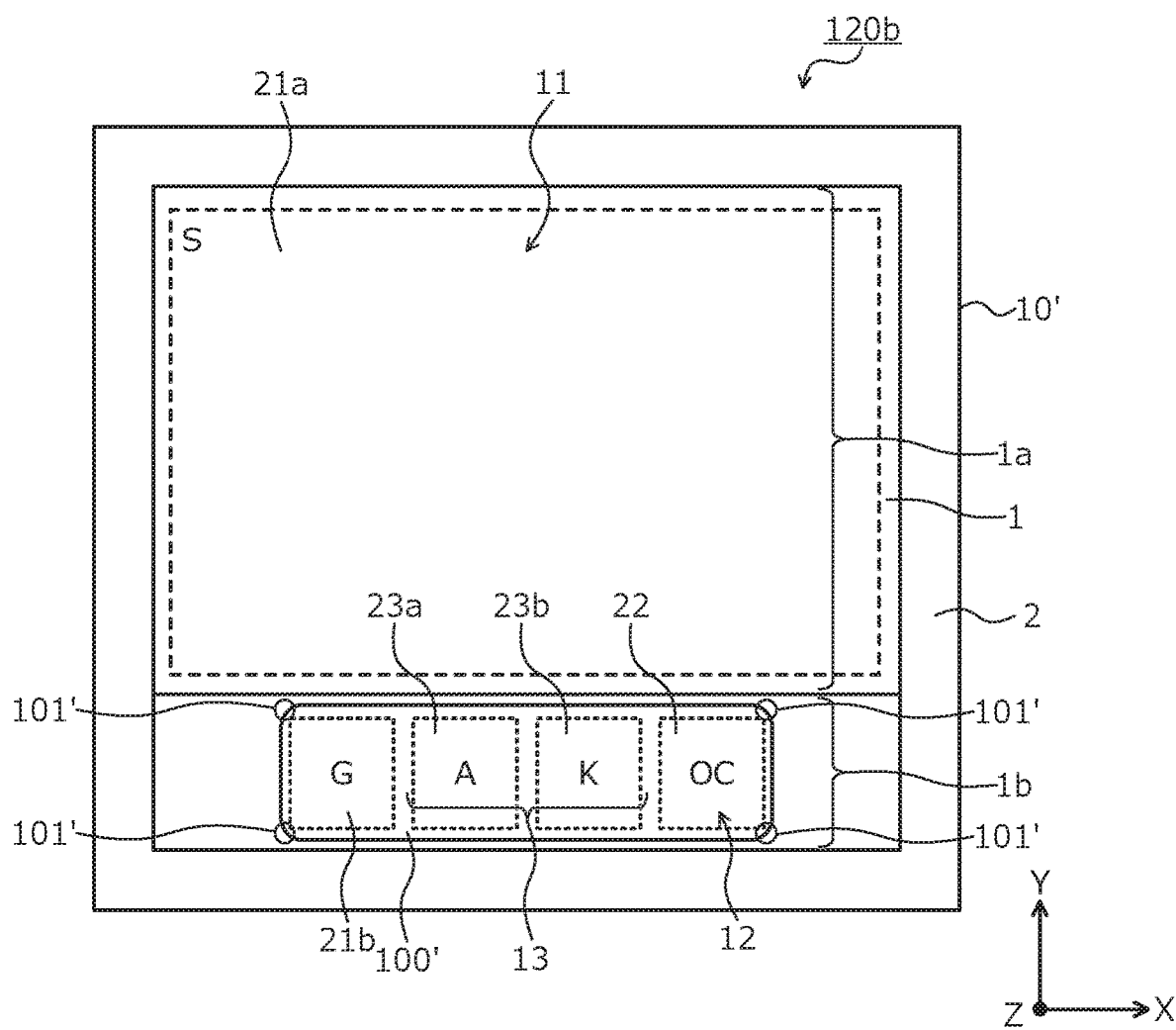
FIG. 13 is a cross-sectional view of a structure of the semiconductor device according to the second embodiment.
Figure 14:
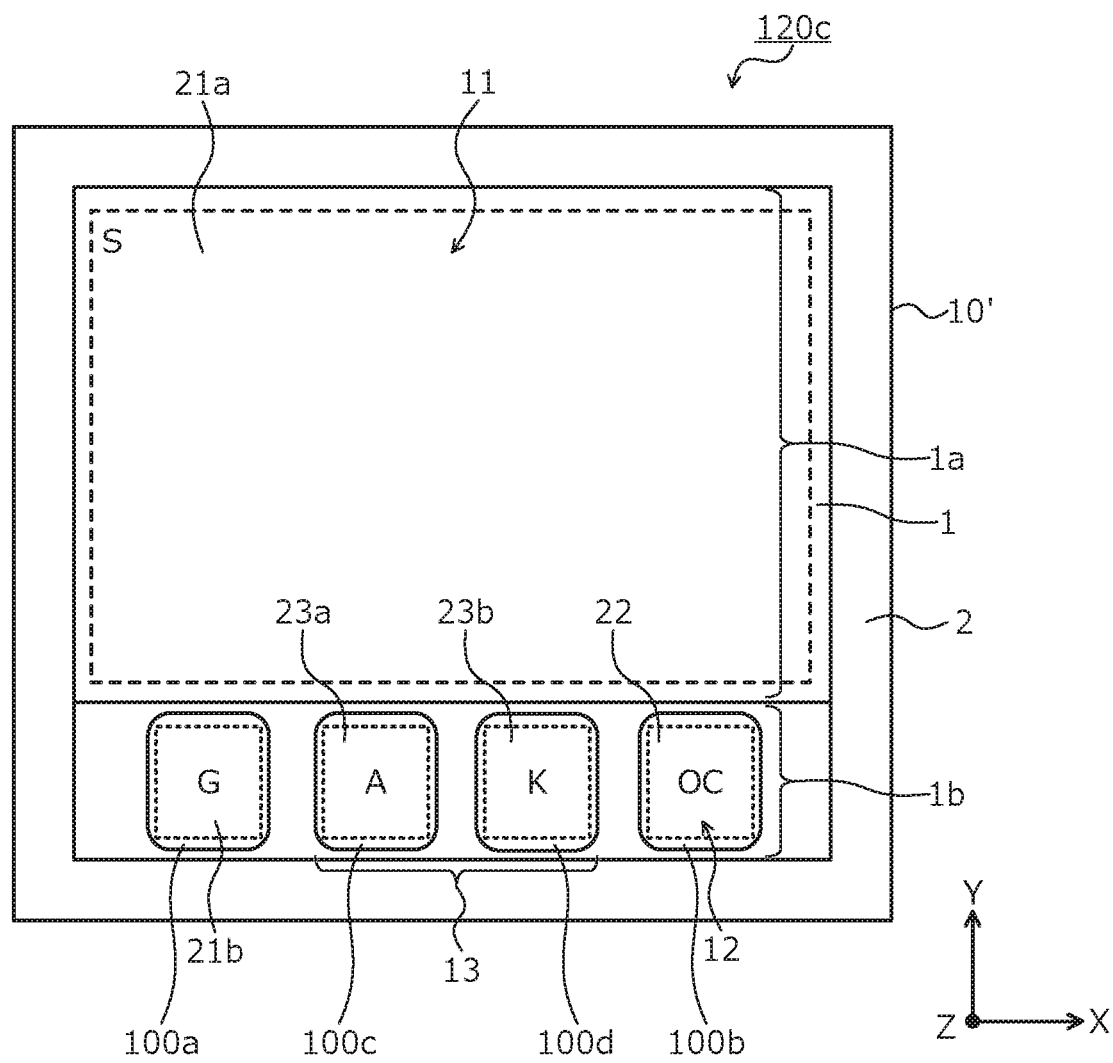
FIG. 14 is a cross-sectional view of a structure of the semiconductor device according to the second embodiment.

Next, a structure of the semiconductor device according to a second embodiment will be described. FIGS. 12, 13, and 14 are cross-sectional views of a structure of the semiconductor device according to the second embodiment. Semiconductor devices 120a to 120c according to the second embodiment differ from the semiconductor device 20 according to the first embodiment (refer to FIG. 1) in that the semiconductor devices 120a to 120c have a high-function structure in which, on a single semiconductor substrate 10', the semiconductor elements (hereinafter, main semiconductor elements) 11 and one or more circuit portions for protecting/controlling the main semiconductor elements 11 are disposed.

In the second embodiment, the effective region 1a of the active region 1 may have a substantially rectangular planar shape. In the effective region 1a of the active region 1, similarly to the first embodiment, unit cells of the main semiconductor elements 11 are provided. In the effective region 1a of the active region 1, the source pad 21a of the main semiconductor elements 11 is provided on a front surface of the semiconductor substrate 10'. The source pad 21a of the main semiconductor elements 11 may have, for example, a substantially rectangular planar shape.

The non-operating region 1b of the active region 1, for example, has a substantially rectangular planar shape and is adjacent to one side of the effective region 1a of the active region 1. The non-operating region 1b of the active region 1, for example, is disposed between the effective region 1a of the active region 1 and the edge termination region 2. In the non-operating region 1b of the active region 1, a circuit portion for protecting/controlling the main semiconductor elements 11 is provided. The circuit portion for protecting/controlling the main semiconductor elements 11 may include, for example, high-function portions such as a current sensing portion (element) 12, a temperature sensing portion (element) 13, and an over-voltage protecting portion (not depicted), and an arithmetic circuit portion (not depicted).

The current sensing portion 12 has a function of detecting overcurrent (OC) flowing in the main semiconductor elements 11. The current sensing portion 12 is a vertical MOSFET that includes unit cells having a configuration similar to that of the main semiconductor elements 11, of a quantity (for example, about 10 to 20) lower than a quantity (for example, about 10,000) of the unit cells of the main semiconductor elements 11. The current sensing portion 12 is disposed separated from the main semiconductor elements 11. The current sensing portion 12 operates under conditions similar to those of the main semiconductor elements 11.

The temperature sensing portion 13 has a function of detecting a temperature of the main semiconductor elements 11 by using diode temperature characteristics. The temperature sensing portion 13, for example, is a poly-silicon diode that is configured by a poly-silicon (poly-Si) layer provided on the field insulating film on the front surface of the semiconductor substrate 10'. The over-voltage protecting portion, for example, is a diode that protects the main semiconductor elements 11 from overvoltage (OV) such as surges. The current sensing portion 12, the temperature sensing portion 13, and the over-voltage protecting portion are controlled by the arithmetic circuit portion and based on output signals of these portions, the main semiconductor elements 11 are controlled.

The arithmetic circuit portion is configured by plural semiconductor elements such as complementary MOS (CMOS) circuits. Therefore, the arithmetic circuit portion, in addition to a front electrode (source electrode, etc., not depicted) of the plural semiconductor elements configuring the arithmetic circuit portion, includes other arithmetic portion pads. When the arithmetic circuit portion is disposed on the semiconductor substrate 10' with the main semiconductor elements 11, element structures (including the front electrode) of the plural semiconductor elements configuring the arithmetic circuit portion may be disposed in the effective region 1a of the active region 1. The main semiconductor elements 11 and the circuit portion that protects/controls the main semiconductor elements 11, for example, have a wiring structure of a similar configuration using the pin-shaped wiring members.

In the non-operating region 1b of the active region 1, the gate pad 21b of the main semiconductor elements 11, an electrode pad (hereinafter, OC pad) 22 of the current sensing portion 12, electrode pads (hereinafter, anode pad and cathode pad) 23a, 23b of the temperature sensing portion 13, an electrode pad (hereinafter, OV pad, not depicted) of the over-voltage protecting portion, an electrode pad (hereinafter, arithmetic portion pad, not depicted) of the arithmetic circuit portion, etc. are disposed on the front surface of the semiconductor substrate 10' separated from each other. These electrode pads of the non-operating region 1b, for example, have a substantially rectangular planar shape.

In FIGS. 12 to 14, the source pad 21a, the gate pad 21b, the OC pad 22, the anode pad 23a, and the cathode pad 23b are depicted as rectangular planar shapes indicated by S, G, OC, A, respectively. Further, FIG. 12 depicts a case in which the gate pad 21b, the anode pad 23a, the cathode pad 23b, and the OC pad 22 all oppose the source pad 21a and are disposed in a single row along the border between the edge termination region 2 and the non-operating region 1b of the active region 1.

All of the electrode pads are disposed separated from each other. Directly beneath the electrode pad of the non-operating region 1b, spanning substantially the non-operating region 1b of the active region 1 overall, a p-type region (second second-conductivity-type region) 100 is provided in a surface region of the front surface of the semiconductor substrate 10' (FIG. 12). The p-type region 100 opposes entire surfaces of all of the electrode pads 21b, 22, 23a, 23b of the non-operating region 1b of the active region 1. In this manner, the p-type region 100 of the non-operating region 1b of the active region 1 suffices to oppose the entire surfaces of all of the electrode pads 21b, 22, 23a, 23b of the non-operating region 1b of the active region 1.

Therefore, a single p-type region (second second-conductivity-type region) 100' opposing all of the electrode pads 21b, 22, 23a, 23b may be provided only directly beneath the electrode pads 21b, 22, 23a, 23b (FIG. 13), or p-type regions 100a, 100b, 100c, 100d may be provided directly beneath the electrode pads 21b, 22, 23a, 23b, respectively (FIG. 14). In any of the configurations depicted in FIGS. 12 to 14, corner portions of the p-type regions 100, 100', 100a to 100d, similarly to the first embodiment, are contoured. Reference numerals 101, 101' are corner portions of the p-type regions 100, 100'.

The p-type region 100 is provided spanning the non-operating region 1b of the active region 1 overall (FIG. 12), thereby enabling carriers from the edge termination region 2 to be efficiently absorbed. By providing the single p-type region 100' only directly beneath the electrode pads 21b, 22, 23a, 23b, opposing all of the electrode pads 21b, 22, 23a, 23b (FIG. 13), while not depicted, a free region (region other than the p-type region 100') of the non-operating region 1b of the active region 1 may be used as the effective region 1a of the active region 1, thereby enabling current capacity of the main semiconductor elements 11 to be increased.

Further, by providing the p-type regions 100a to 100d directly beneath and opposing the electrode pads 21b, 22, 23a, 23b, respectively (FIG. 14), the electrode pads may each be disposed at a corresponding optimal position. Furthermore, while not depicted, a free region (region between the p-type regions 100a to 100d that are adjacent to each other) of the non-operating region 1b of the active region 1 may be used as the effective region 1a of the active region 1, thereby enabling the current capacity of the main semiconductor elements 11 to be increased.

As described above, according to the second embodiment, even when the plural electrode pads are disposed in the non-operating region of the active region, the p-type region is disposed directly beneath all of the electrode pads so as to oppose surfaces of all of the electrode pads and the corner portions of the p-type region are contoured, thereby enabling effects similar to those of the first embodiment to be obtained.

Figure 15:
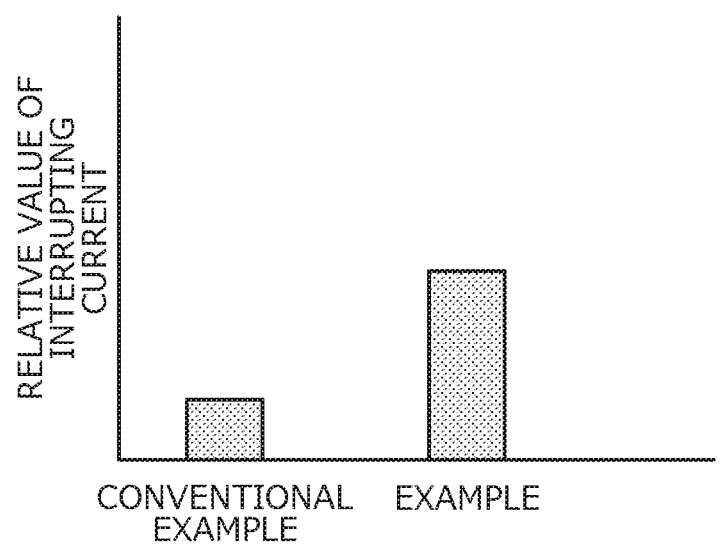
FIG. 15 is a diagram depicting comparison results of amounts of interrupting current for an example and a conventional example.

Results of comparison of the amount of electron hole current (interrupting current) that passes through the p-type region of the non-operating region and out to the source pad when the parasitic diode of the active region turns OFF, for the semiconductor device 20 according to the first embodiment described above (hereinafter, example, refer to FIGS. 1, 5) and for the conventional semiconductor device 220 (hereinafter, conventional example, refer to FIG. 16) are depicted in FIG. 15. FIG. 15 is a diagram depicting comparison results of amounts of interrupting current for the example and the conventional example.

As depicted in FIG. 15, in the example, the amount of electron hole current that passes out to the source pad 21a when the parasitic diodes 60a, 60b of the active region 1 turn OFF was confirmed to be greater as compared to the conventional example. A reason for this is that when the parasitic diodes 60a, 60b of the active region 1 turn OFF, electron hole current does not concentrate at the corner portions 81 of the p-type region 34b, of the non-operating region 1b of the active region 1, whereby the reverse recovery capability of the parasitic diode 60b of the non-operating region 1b of the active region 1 may be enhanced.

While not depicted, with the semiconductor devices 120a to 120c according to the second embodiment as well, effects similar to those of the example are obtained.

In the foregoing, the present invention is not limited to the embodiments above and various modifications within a range not departing from the spirit of the invention are possible. For example, in a case in which an electrode pad other than those taken as examples in the embodiments described above is disposed on a single semiconductor substrate with a main semiconductor element and a parasitic diode is formed by a pn junction between an n⁻-type drift region and a p-type region provided directly beneath the electrode pad, corner portions of the p-type region are contoured, whereby effects of the present invention are further obtained. The present invention is further applicable in cases in which instead of silicon carbide as the semiconductor material, a wide bandgap semiconductor material other than silicon carbide is used as the semiconductor material.

According to the invention described above, when a parasitic diode formed by a pn junction between a second second-conductivity-type region and a first-conductivity-type region turns OFF, current that passes through the second second-conductivity-type region and out to a source pad does not concentrate at corner portions of the second second-conductivity-type region. As a result, local increases of the electric field at the corner portions of the second second-conductivity-type region may be prevented.

The semiconductor device according to the present invention achieves an effect in that the reverse recovery capability of a parasitic diode may be enhanced.

In this manner, the semiconductor device according to the present invention is useful for power semiconductor devices used in power converting equipment and in power source devices of various types of industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device having an active region that includes an effective region and a non-operating region, comprising:
    a semiconductor substrate containing a semiconductor material having a bandgap wider than a bandgap of silicon, the semiconductor substrate having a first main surface and a second main surface opposite to the first main surface;
    a first-conductivity-type region of a first conductivity type, provided in the semiconductor substrate, the first-conductivity-type region having a first side, and a second side opposite to the first side and facing the second main surface of the semiconductor substrate;
    a first second-conductivity-type region of a second conductivity type provided in the semiconductor substrate, the first second-conductivity-type region having a first side, and a second side opposite to the first side and facing the second main surface of the semiconductor substrate, the second side of the first second-conductivity-type region being positioned closer to the first main surface of the semiconductor substrate than is the second side of the first-conductivity-type region and being in contact with the first-conductivity-type region;
    an insulated gate electric field effect transistor having
        a drift region that is formed by the first-conductivity-type region disposed in the effective region,
        a base region that is formed by the first second-conductivity-type region disposed in the effective region,
        a source pad provided on the first main surface of the semiconductor substrate and being electrically connected to the first second-conductivity-type region, the source pad facing the first side of the first second-conductivity-type region in a depth direction orthogonal to the first main surface of the semiconductor substrate, and
        a gate pad provided in the non-operating region, the gate pad being provided on the first main surface of the semiconductor substrate and being apart from the source pad;
    a drain electrode electrically connected to the second main surface of the semiconductor substrate;
    a second second-conductivity-type region of the second conductivity type, provided in the semiconductor substrate in the non-operating region, the second second-conductivity-type region having a first side facing the gate pad in the depth direction, and a second side opposite to the first side and facing the second main surface of the semiconductor substrate, the second side of the second second-conductivity-type region being positioned closer to the first main surface of the semiconductor substrate than is the second side of the first-conductivity-type region and being in contact with the first-conductivity-type region; and
    a third second-conductivity-type region of the second conductivity type, provided in the second second-conductivity-type region, an impurity concentration of the third second-conductivity-type region being higher than an impurity concentration of the second second-conductivity-type region, wherein
    the second second-conductivity-type region is electrically connected to the source pad via the third second-conductivity-type region, and has a rectangular planar shape with four corner portions, each of the corner portions having a rounded or chamfered shape in a planar view, and
    the third second-conductivity-type region surrounds a center portion of the second second-conductivity-type region in the planar view.

2. The semiconductor device according to claim 1, further comprising:
    one or more of active elements provided on the semiconductor substrate, each of the active elements having an electrode pad that is provided in the non-operating region on the first main surface of the semiconductor substrate and is apart from the source pad and the gate pad in the planar view, wherein
    the first side of the second second-conductivity-type region faces the gate pad, and the electrode pad of said each active element.

3. The semiconductor device according to claim 2, wherein
    the gate pad and the electrode pad of said each active element are disposed in a part of the non-operating region in the planner view, and
    the second second-conductivity-type region covers the entire non-operating region in the planner view.

4. The semiconductor device according to claim 2, wherein the second second-conductivity-type region covers a part of the non-operating region in which the gate pad and the electrode pad of said each active element are disposed in the planner view.

5. The semiconductor device according to claim 1, further comprising:

one or more of active elements other than the insulated gate electric field effect transistor, and being provided on the semiconductor substrate, each of the active elements has an electrode pad, the electrode pad of said each active element being provided in the non-operating region, on the first main surface of the semiconductor substrate, and being apart from the source pad and the gate pad in the planner view, wherein the first side of the second second-conductivity-type region faces the gate pad and the electrode pad of said each active element, respectively, the first side of the second second-conductivity-type region being disposed at a position in the depth direction apart from the first main surface of the semiconductor substrate on which the gate pad and the electrode pad of said each active element.

6. The semiconductor device according to claim 1, wherein each of the corner portions of the second second-conductivity-type region has the rounded shape.

7. The semiconductor device according to claim 1, wherein each of the corner portions of the second second-conductivity-type region has the chamfered shape, and the chamfered shape is with obtuse angles.

\* \* \* \* \*